(12) United States Patent
Kouno

(10) Patent No.: US 9,698,769 B2
(45) Date of Patent: Jul. 4, 2017

(54) SEMICONDUCTOR DEVICE

(71) Applicant: DENSO CORPORATION, Kariya, Aichi-pref. (JP)

(72) Inventor: Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/781,323

(22) PCT Filed: Apr. 7, 2014

(86) PCT No.: PCT/JP2014/001979
§ 371 (c)(1),
(2) Date: Sep. 30, 2015

(87) PCT Pub. No.: WO2014/167824
PCT Pub. Date: Oct. 16, 2014

(65) Prior Publication Data
US 2016/0056810 A1   Feb. 25, 2016

(30) Foreign Application Priority Data

Apr. 10, 2013   (JP) .................................. 2013-082394

(51) Int. Cl.
*H03K 17/687* (2006.01)
*H03K 17/16* (2006.01)
(Continued)

(52) U.S. Cl.
CPC ....... *H03K 17/168* (2013.01); *H01L 27/0652* (2013.01); *H01L 27/0722* (2013.01);
(Continued)

(58) Field of Classification Search
CPC ....... H01L 2924/00; H01L 2924/00012; H01L 2924/00014; H01L 2224/48227; H01L 2224/48091
See application file for complete search history.

(56) References Cited

U.S. PATENT DOCUMENTS 6,180,966 B1   1/2001   Kohno et al.
2006/0215341 A1   9/2006   Sakurai et al.
(Continued)

FOREIGN PATENT DOCUMENTS

JP   H11-17179 A   1/1999
JP   3733986 B2   1/2006
(Continued)

OTHER PUBLICATIONS

International Search Report of the International Searching Authority mailed Jun. 3, 2014 for the corresponding international application No. PCT/JP2014/001979 (and English translation).

(Continued)

*Primary Examiner* — Sibin Chen
(74) *Attorney, Agent, or Firm* — Posz Law Group, PLC

(57) ABSTRACT

A semiconductor device includes: a diode-integrated IGBT element in a same semiconductor substrate having a diode element and an IGBT element driven by a drive signal towards a gate; a sense element having a diode sense element with a current proportional to a current through the diode element and an IGBT sense element with a current proportional to a current through the IGBT element; a switch element connected to a first current pathway through the diode sense element and to a second current pathway different from the first current pathway. The switch element is turned off to control the second current pathway to be discontinuous with the first current pathway when no current flows through the diode sense element, and is turned on to control the second current pathway to be continuous with the first current pathway and apply a current when a current flows through the diode sense element.

8 Claims, 16 Drawing Sheets

(51) Int. Cl.
H03K 17/082 (2006.01)
H01L 27/06 (2006.01)
H03K 17/567 (2006.01)
H01L 27/07 (2006.01)

(52) U.S. Cl.
CPC ..... *H01L 27/0727* (2013.01); *H03K 17/0828* (2013.01); *H03K 17/567* (2013.01)

(56) References Cited

U.S. PATENT DOCUMENTS

| | | |
|---|---|---|
| 2008/0315248 A1 | 12/2008 | Tokura et al. |
| 2009/0001912 A1* | 1/2009 | Miyajima ................. H02P 6/15 318/400.04 |
| 2009/0057832 A1 | 3/2009 | Kouno |
| 2010/0090248 A1 | 4/2010 | Kouno |
| 2010/0156506 A1 | 6/2010 | Tsuzuki et al. |
| 2010/0187567 A1 | 7/2010 | Tanabe et al. |
| 2011/0058399 A1* | 3/2011 | Honsberg ............ H02M 7/5395 363/98 |
| 2011/0298446 A1 | 12/2011 | Shiraki et al. |
| 2012/0025264 A1 | 2/2012 | Kouno |
| 2012/0056242 A1 | 3/2012 | Tsuzuki et al. |
| 2012/0098573 A1 | 4/2012 | Sasaki |
| 2013/0334567 A1 | 12/2013 | Kouno |

FOREIGN PATENT DOCUMENTS

| | | |
|---|---|---|
| JP | 2007-14059 A | 1/2007 |
| JP | 2014-229642 A | 12/2014 |

OTHER PUBLICATIONS

Written Opinion of the International Searching Authority mailed Jun. 3, 2014 for the corresponding international application No. PCT/JP2014/001979 (and English translation).

* cited by examiner

SEMICONDUCTOR DEVICE

CROSS REFERENCE TO RELATED APPLICATIONS

This application is a U.S. national stage of International Application No. PCT/JP2014/001979 filed on Apr. 7, 2014 and is based on Japanese Patent Application No. 2013-82394 filed on Apr. 10, 2013, the disclosure of which is incorporated herein by reference.

TECHNICAL FIELD

The present invention relates to a semiconductor device.

BACKGROUND ART

The prior art proposes a diode-integrated IGBT element that includes a diode device and an IGBT device on the same semiconductor substrate (e.g., see Patent Literature 1). In the diode-integrated IGBT element, one electrode is used as an anode electrode for the diode element and an emitter electrode for the IGBT element in common. Another electrode is used as a cathode electrode for the diode element and a collector electrode for the IGBT element in common. This type of diode-integrated IGBT element is built in an inverter circuit to apply PWM control to a load.

PRIOR ART LITERATURES

Patent Literature

Patent Literature 1: JP-2009-268054-A

SUMMARY OF INVENTION

The semiconductor device disclosed in Patent Literature 1 includes a diode sense element structured identically to the diode element for the diode-integrated IGBT element. The diode sense element connects with a sense resistor. The diode sense element determines whether or not an electric current flows through the diode sense element (i.e., the diode element), based on a potential difference between both ends of the sense resistor. When a current flows through the diode element, the diode sense element provides control to stop driving the IGBT element to avoid interference between the diode element and the IGBT element.

However, the semiconductor device disclosed in Patent Literature 1 has difficulty in detecting a small-current region. This is because the semiconductor device detects a potential difference between both ends of the sense resistor series-connected to the diode sense element and compares the potential difference with a threshold value to determine whether or not a current flows through the diode element. Decreasing a current flowing through the diode element decreases the potential difference (i.e., output voltage) between both ends of the sense resistor. This relatively increases an effect of a noise (such as a switching noise resulting from switching a drive signal applied to the IGBT element) and may unsuccessfully or incorrectly detect the diode operation.

The present disclosure has been made in consideration of the foregoing. It is an object of the disclosure to provide a semiconductor device capable of more accurately detecting operation of a diode element even if a small current flows through the diode element when the semiconductor device includes a diode-integrated IGBT element including an IGBT element and the diode element provided on the same semiconductor substrate.

A semiconductor device according to an aspect of the disclosure includes a diode-integrated IGBT element, a sense element, a switch element, and a current detection unit. The diode-integrated IGBT element includes a diode element and an IGBT element provided for a same semiconductor substrate. A drive signal supplied to a gate drives the IGBT element. The sense element includes a diode sense element and an IGBT sense element. The diode sense element is supplied with a current proportional to a current flowing through the diode element. The IGBT sense element is supplied with a current proportional to a current flowing through the IGBT element. The switch element is connected to a first current pathway passing through the diode sense element and to a second current pathway different from the first current pathway. The switch element turns off when no current flows through the diode sense element to allow the second current pathway to be discontinuous with the other current pathway. The switch element turns on when a current flows through the diode sense element to allow the second current pathway to be continuous with the other current pathway and apply a current to the second current pathway. The current detection unit detects an electric current state of the second current pathway.

According to the aspect, the second current pathway is provided independently of the first current pathway passing through the diode sense element. The switch element is provided to be able to switch between continuous and discontinuous states between the second current pathway and the other current pathway. The switch element turns off when no current flows through the diode sense element. The switch element turns on when a current flows through the diode sense element. An electric current state of the second current pathway greatly varies depending on whether or not a current flows through the diode sense element. The current detection unit detects an electric current state of the second current pathway to be able to more accurately and easily detect whether or not a current flows through the diode sense element.

EMBODIMENTS FOR CARRYING OUT INVENTION

Figure 1:
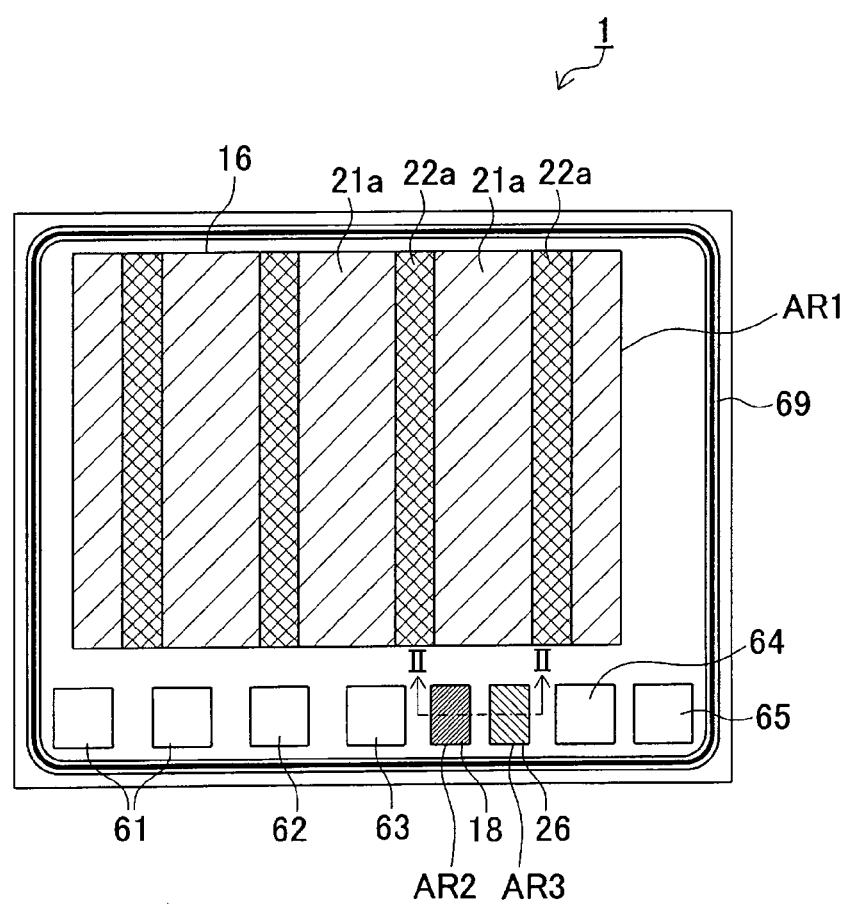
FIG. 1 is a pattern diagram illustrating a planar configuration of a semiconductor substrate in a semiconductor device according to a first embodiment.

Embodiments of the present invention will be described with reference to the accompanying drawings. The mutually corresponding or comparable parts in the embodiments are designated by the same reference numerals in the drawings. Throughout the embodiments, N type, N− type, and N+ type correspond to a first conductivity type according to the invention, and P type and P+ type correspond to a second conductivity type according to the invention. The IGBT element is exemplified as an N-channel type.

(First Embodiment)

The following describes the first embodiment of the invention with reference to FIGS. 1 through 6. A semiconductor device 1 according to the embodiment is used as a power switching element (hereinafter referred to as a diode-integrated IGBT element) used for EHV inverter modules. The semiconductor device 1 is not limited to this example but can be used as various vehicular switching elements.

Figure 2:
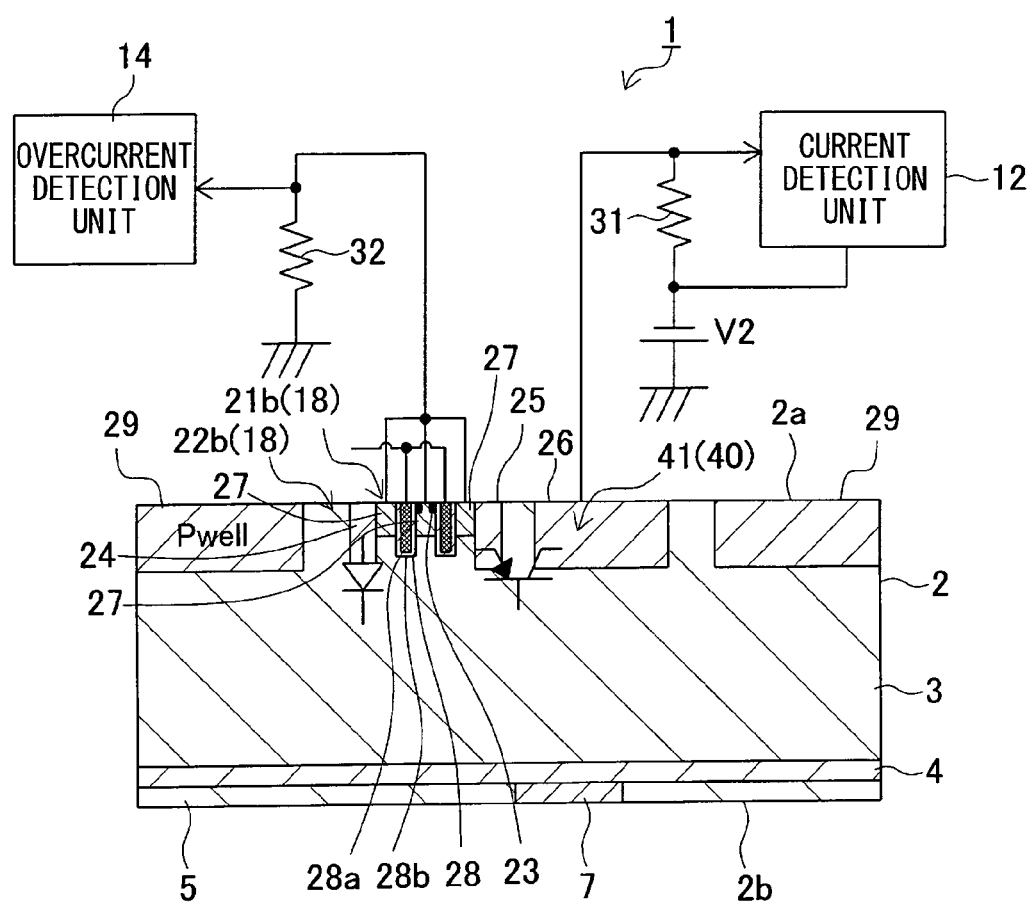
FIG. 2 is a pattern diagram illustrating a cross sectional view and a circuit configuration taken along the line II-II of the semiconductor device in FIG. 1.
Figure 3:
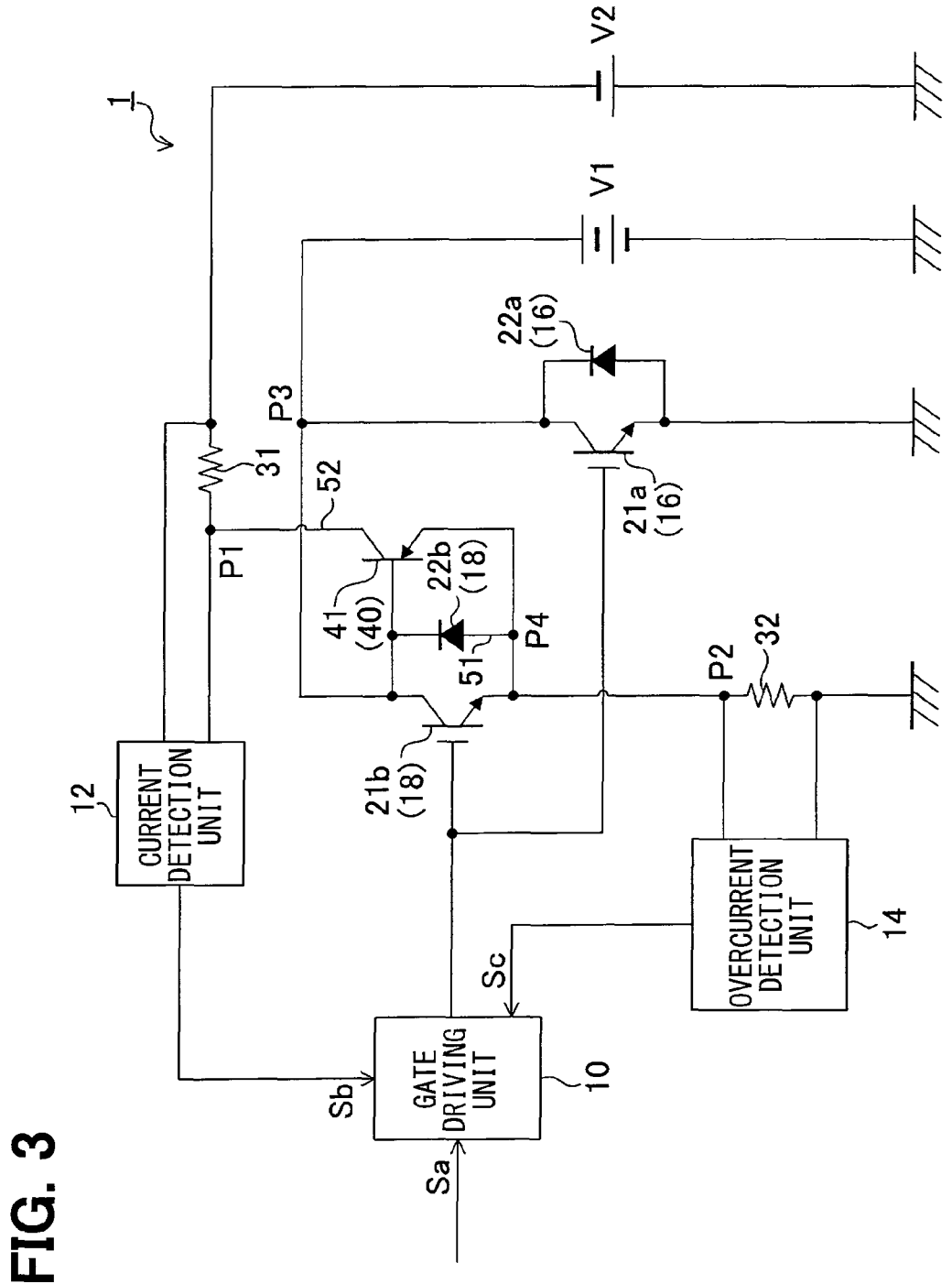
FIG. 3 is a circuit diagram illustrating a circuit configuration of the semiconductor device according to the first embodiment.

As illustrated in FIGS. 1 through 3, the semiconductor device 1 according to this configuration mainly includes a diode-integrated IGBT element 16, a sense element 18, a switch element 40, a current detection unit 12, a gate driving unit 10, an overcurrent detection unit 14, a first resistor 31, and a second resistor 32. These components will be described in detail below.

FIG. 1 is a planar schematic diagram. To be more comprehensible, a main region AR1 (i.e., a region for the diode-integrated IGBT element 16) includes a hatched region for an IGBT element 21a and a crosshatched region for a diode element 22a. A region AR2 includes an IGBT sense element 21b and a diode sense element 22b and is hatched differently from the region AR1. A collector region AR3 for the switch element 40 is hatched differently from the regions AR1 and AR2.

As illustrated in FIGS. 1 and 2, the semiconductor device 1 includes a semiconductor substrate 2 of first conductivity type. As illustrated in FIG. 1, the semiconductor substrate 2 includes the main region AR1 and a sense region AR2 whose principal surface is smaller than the main region AR1 (see in plan view as illustrated in FIG. 1). The main region AR1 forms the diode-integrated IGBT element 16 including the IGBT element 21a and a diode element (hereinafter referred to as an FWD element) 22a as a commutation diode element. The sense region AR2 includes an IGBT sense element 21b formed as a dedicated sense element for the IGBT element 21a and a diode sense element 22b formed as a dedicated sense element for the diode element (i.e., FWD element) 21b. The semiconductor device 1 according to the configuration includes the sense element 18 formed over the semiconductor substrate 2 where the diode-integrated IGBT element 16 is formed. The diode-integrated IGBT element 16 and the sense element 18 are formed over the same substrate.

As illustrated in FIG. 1, the main region AR1 and a looped peripheral region to surround the main region AR1 are formed over a first principal surface 2a (FIG. 2) of the semiconductor substrate 2. Constituent components of the diode-integrated IGBT element 16 (i.e., RC-IGBT element) are formed in the AR1. Constituent components of the sense element 18 are formed in part of the peripheral region. The sense region AR2 is configured to be smaller than the main region AR1 in terms of the size (i.e., area) along the first principal surface 2a of the semiconductor substrate 2. The peripheral region also configures a pressure-proof region 69 (such as a guard ring) to ensure pressure resistance so as to surround the main region AR1 and the sense region AR2. In FIG. 1, a pad 61 senses the temperature. A gate pad 62 supplies a drive signal to gate electrodes (i.e., a gate electrode for the IGBT element 21a and a gate electrode 28a (FIG. 2) for the IGBT sense element 21b). An IGBT sense pad 63 is connected to an emitter region 23 for the IGBT sense element 21b. A diode sense pad 64 is connected to a collector region 26. An emitter pad 65 is connected to an emitter of the IGBT element 21a.

The semiconductor substrate 2 according to the configuration uses an N-type (N−) single-crystal bulk silicon substrate (i.e., FZ wafer) whose impurity concentration is approximately $1 \times 10^{14}$ cm$^{-3}$. The main region AR1 of the semiconductor substrate 2 functions as a drift layer for the IGBT element 21a and a cathode of the diode element (i.e., PN junction diode) 22a. A P-type (P) region (not shown) is selectively formed over a surface layer corresponding to the first principal surface 2a of the semiconductor substrate 2 in the main region AR1. The RC-IGBT element (i.e., diode-integrated IGBT element 16) in the main region AR1 complies with a known configuration and a detailed description is omitted for simplicity.

The sense region AR2 includes the IGBT sense element 21b that is formed based on the same structure as the IGBT element 21a of the main region AR1 and allows flow of a current proportional to a current flowing through the IGBT element 21a. The current flowing through the IGBT sense element 21b is smaller than the current flowing through the IGBT element 21a. Increasing the current flowing through the IGBT element 21a increases the current flowing through the IGBT sense element 21b. The sense region AR2 includes the diode sense element 22b that is formed based on the same structure as the diode element (i.e., FWD element) 22a and allows flow of a current proportional to a current flowing through the diode element 22a. The current flowing through the diode sense element 22b is smaller than the current flowing through the diode element 22a. Increasing the current flowing through the diode element 22a increases the current flowing through the diode sense element 22b. The IGBT sense element 21b and the diode element 22a function as the sense element 18. The area of the IGBT sense element 21b is approximately 1/1000 of the area of the IGBT element 21a. The area of the diode sense element 22b is approximately 1/1000 of the area of the diode element 22a.

As illustrated in FIG. 2, a P-type (P) base region 27 is selectively formed in the region AR2 to configure the sense element 18 in the surface layer toward the first principal surface 2a of the semiconductor substrate 2. The base region 27 functions as a channel formation region for the IGBT sense element 21b. An impurity concentration of the base region 27 is approximately $2 \times 10^{17}$ cm−3.

Several trench portions 28 are selectively formed in the base region 27 so as to pierce the base region 27 from the first principal surface 2a of the semiconductor substrate 2. The bottom of the trench portion 28 reaches an N-region 3 of the semiconductor substrate 2. A gate insulation film 28b is provided for an inner wall (i.e., bottom and side of the trench) in the trench portion 28. The trench inside the gate insulation film 28b is filled with polysilicon to configure the gate electrode 28a. The impurity concentration of the polysilicon is approximately $1 \times 10^{20}$ cm−3. Each gate electrode 28a extends in a longer direction as specified. The gate electrode 28a is formed repeatedly at a specified interval in a direction (i.e., arrangement direction) orthogonal to the longer direction and a thickness direction (of the semiconductor substrate 2). Since the gate electrode 28a is formed in a stripe, the base region 27 is arranged in a given direction (arrangement direction) and is segmented into several base regions (i.e., cells) 27. The base region is arranged in the same arrangement direction in the main region AR1 and the sense region AR2.

The N-type (N+) emitter region 23 is selectively formed in the base region 27 over the surface layer toward the first principal surface 2a adjacently to the side of the trench portion 28 (the side of the gate insulation film 28b). According to the configuration, the emitter region 23 extends in the longer direction (of the gate electrode 28a) adjacent to the trench portion 28 including the gate electrode 28a. The impurity concentration of the emitter region 23 is approximately $1 \times 10^{19}$ cm−3. The emitter region 23 is electrically connected to an emitter electrode (not shown) made of an aluminum material, for example.

A P-type (P) anode region 24 is selectively formed in the region AR2 to configure the sense element 18 over the surface layer toward the first principal surface 2a of the semiconductor substrate 2. The anode region 24 functions as an anode of the diode sense element 22b. A P-type (P+) contact region (not shown) is selectively formed over the surface layer toward the first principal surface 2a of the anode region 24. The concentration of the contact region is approximately $1 \times 10^{19}$ cm−3.

A P-type (P+) collector layer 5 is selectively formed including a region immediately below the base region 27 over the surface layer toward the second principal surface 2b of the semiconductor substrate 2 in the sense region AR2. The collector layer 5 according to the embodiment features a thickness of approximately 0.5 μm and a concentration of approximately $1 \times 10^{18}$ cm−3. An N conductivity type (N+) cathode layer 7 is selectively formed over the surface layer toward the second principal surface 2b of the semiconductor substrate 2 except the range to form the collector layer 5. The cathode layer 7 features a thickness of approximately 0.5 μm and a concentration of approximately $1 \times 10^{20}$ cm−3. The collector layer 5 and the cathode layer 7 are electrically connected to a collector electrode (not shown) shared by a collector layer and a cathode layer (not shown) in the main region AR1.

The IGBT sense element 21b and the diode sense element 22b are formed in the sense region AR2 of the semiconductor substrate 2 according to the configuration.

A P-type (P) emitter region 25 is selectively formed in the region AR2 to configure the sense element 18 over the surface layer toward the first principal surface 2a of the semiconductor substrate 2. The emitter region 25 functions as an emitter of the switch element 40 to be described later. The emitter region 25 features approximately the same concentration as the anode region 24 described above and the collector region 26 to be described later.

A P-type (P) collector region 26 is selectively formed at a position distant from the emitter region 25 over the surface layer toward the first principal surface 2a of the semiconductor substrate 2. The collector region 26 functions as a collector of the switch element 40 to be described later. An N conductivity-type region intervenes between the emitter region 25 and the collector region 26 to configure a PNP transistor 41 that functions as the switch element 40. When a current flowing through the diode sense element 22b in this configuration, a diode current flowing from a P-well layer of the diode sense element 22b partially flows through a P-well layer as a collector of the PNP transistor 41.

A P-type (P) well region 29 is formed to sandwich the N-type region around the sense region AR2 and the collector region AR3 over the surface layer toward the first principal surface 2a of the semiconductor substrate 2. The well region 29 is connected to the ground.

According to the configuration, as illustrated in FIG. 2, an N-type (N) field stop layer 4 is formed all over the second principal surface 2b corresponding to the cathode layer 7 and the collector layer 5 provided for the second principal surface 2b of the semiconductor substrate 2 so as to be adjacent to the first principal surface 2a. The field stop layer 4 uses an impurity concentration between the semiconductor substrate 2 and the cathode layer 7.

A known semiconductor process can be used to form the semiconductor device 1 according to the configuration. Therefore, a description about the process is omitted for simplicity.

(Circuit Configuration)

The following describes the circuit configuration of the semiconductor device 1 according to the configuration.

The diode-integrated IGBT element 20 is structured to provide the diode element 22a and the IGBT element 21a for the same semiconductor substrate 2. A drive signal is supplied to the gate to drive the IGBT element 21a.

According to an example in FIG. 3, a collector of the IGBT element 21a and a collector of the IGBT sense element 21b are connected in common. A main power supply V1 is connected to the collectors. Though not illustrated, a load such as a motor may be connected toward the collector (between P3 and the main power supply V1) of IGBT element 21a. An emitter of the IGBT element 21a is connected to the ground. A gate of the IGBT element 21a and a gate of the IGBT sense element 21b are connected in common. The gate of the IGBT element 21a is supplied with a drive signal from the gate driving unit 10 to be described later. The anode side of the diode element 22a is connected to the emitter of the IGBT element 21a. The cathode side of the diode element 22a is connected to the collector of the IGBT element 21a. The diode element 22a is connected to the IGBT element 21a in parallel and functions as a free wheeling diode.

As described above, the sense element 18 includes the diode sense element 22b and the IGBT sense element 21b. The diode sense element 22b allows flow of a current proportional to a current flowing through the diode element 22a. The IGBT sense element 21b allows flow of a current proportional to a current flowing through the IGBT element 21a. The gate of the IGBT sense element 21b is connected to the gate of the IGBT sense element 21b in common and is supplied with a drive signal from the gate driving unit 10 to be described later. The collector of the IGBT sense element 21b and the collector of the IGBT element 21a are connected in common. The emitter of the IGBT sense element 21b connects with the second resistor 32 to be described later.

The anode side of the diode sense element 22b is connected to the emitter of the IGBT sense element 21b. The cathode side of the diode sense element 22b is connected to the collector of the IGBT sense element 21b. The diode sense element 22b is connected to the IGBT sense element 21b in parallel. The diode sense element 22b functions as a free wheeling diode. According to this configuration, a first current pathway 51 passes through the diode sense element 22b to apply a current to the diode sense element 22b. Suppose that P4 denotes a connection position (i.e., branch position) between the anode of the diode sense element 22b and the emitter of the switch element 40. The first current pathway 51 leads to the diode sense element 22b from P4. The first current pathway 51 corresponds to an example of "other current pathways." When the switch element 40 turns on, a second current pathway 52 passes through the switch element 40 from position P4 and is connected to the collector of the switch element 40.

The switch element 40 includes the PNP-type bipolar transistor 41 formed in the semiconductor substrate 2. The switch element 40 turns on when a current flows through the diode sense element 22b. According to the example in FIG. 3, the base of the switch element 40 is connected to the cathode of the diode sense element 22b. The emitter of the switch element 40 is connected to the anode of the diode sense element 22b and the emitter of the IGBT sense element 21b.

The collector of the switch element 40 is connected to the second current pathway 52. The second current pathway 52 includes the first resistor 31 and a sense power supply V2. The first resistor 31 corresponds to an example of a "resistor unit." One end of the first resistor 31 connects with a lower potential side of the sense power supply V2. The sense power supply V2 supplies a negative voltage. A higher potential side of the sense power supply V2 is connected to the ground. The other end of the first resistor 31 is continuous with the collector of the switch element 40 and is connected to the anode side of the diode sense element 22b via the switch element 40.

When no current flows through the diode sense element 22b, the switch element 40 according to this configuration turns off to allow the first current pathway 51 and the second current pathway 52 to be discontinuous. In the normal state, the current flows from the collector to the emitter of the IGBT sense element 21b. The emitter potential of the switch element 40 is higher than the base potential thereof, allowing the switch element 40 to turn off. This causes the second current pathway 52 to be discontinuous with the emitter of the IGBT sense element 21b and the anode of the diode sense element 22b. No current flows between the emitter and the collector of the switch element 40.

An inverse electromotive force causes the collector of the IGBT sense element 21b to be a low potential, thus allowing a current to flow through the diode sense element 22b. In this case, the emitter potential of the switch element 40 is lower than the base potential thereof, allowing the switch element 40 to turn on. The first current pathway 51 is continuous with the second current pathway 52, thus allowing a current to flow between the emitter and the collector of the switch element 40. An inverse current flowing through the second resistor 32 from the ground branches into the diode sense element 22b and the switch element 40. The current flows through both pathways.

According to the example in FIG. 3, the sense power supply V2 is provided at a specified position of the second current pathway 52. A higher potential side of the sense power supply V2 is connected to the ground. A lower potential side thereof is connected to one end of the first resistor 31. When the switch element 40 turns on, the first resistor 31 allows flow of a current corresponding to the potential at the anode side of the diode sense element 22b and the potential at one end of the first resistor 31 (i.e., a potential difference between the potential at the anode side of the diode sense element 22b and a negative potential of the sense power supply V2).

(Control Structure and Operation of the Semiconductor Device)

With reference to FIG. 3, the following describes a control structure and operation of the semiconductor device 1.

According to the configuration, an external circuit such as a PWM signal generation circuit generates a PWM gate signal as a drive signal to drive the IGBT element 21a of the semiconductor device. PWM gate signal Sa is input to the gate driving unit (i.e., gate driving circuit) 10. The PWM gate signal flows through the gate driving unit 10 configured as an AND circuit and controls a gate voltage in the IGBT element 21a for the main region and the IGBT sense element 21b for current detection.

If the gate driving unit (i.e., AND circuit) 10 permits flow of the PWM gate signal, the PWM gate signal, when set to the H level, turns on the IGBT element 21a and the IGBT sense element 21b to drive these elements. The PWM gate signal, when set to the L level, turns off the IGBT element 21a and the IGBT sense element 21b to stop driving these elements. If the gate driving unit (i.e., AND circuit) 10 inhibits (or stops) flow of the PWM gate signal, the IGBT element 21a and the IGBT sense element 21b are not driven.

The gate driving unit 10 is capable of supplying an on-signal (i.e., H-level signal) and an off-signal (i.e., L-level signal) to the gate of the IGBT element 21a. The gate driving unit 10 is configured as an AND circuit. The gate driving unit 10 controls whether or not to permit PWM gate signal Sa to flow through, based on signal Sb from the current detection unit 12 and signal Sc from the overcurrent detection unit 14. The flow of PWM gate signal Sa is permitted if signal Sb from the current detection unit 12 and signal Sc from the overcurrent detection unit 14 are set to the H level. Suppose that signal Sb from the current detection unit 12 and signal Sc from the overcurrent detection unit 14 are set to the H level. PWM gate signal Sa, when set to the H level, allows the gate driving unit 10 to output an H-level signal. PWM gate signal Sa, when set to the L level, allows the gate driving unit 10 to output an L-level signal. The gate driving unit 10 operates to permit the flow of PWM gate signal Sa.

Suppose that one of signal Sb from the current detection unit 12 and signal Sc from the overcurrent detection unit 14 is set to the L level. In this case, the gate driving unit 10 continues to output an L-level signal. The gate driving unit 10 operates to inhibit (or stop) the flow of PWM gate signal Sa.

The current detection unit 12 includes a function to detect an electric current state of the second current pathway 52. The current detection unit 12 is supplied with an input signal, namely, potential difference Vsfw (also denoted as Vs_fw) between both ends of the first resistor 31. The current detection unit 12 compares the input signal (i.e., potential difference Vsfw) with a specified threshold value to detect a current flowing through the first resistor 31. Potential difference Vsfw provides a potential difference between both ends with reference to position P1. Potential difference Vsfw is negative if position P1 is higher. Potential difference Vsfw is positive if position P1 is lower. The current detection unit 12 includes diode current detection threshold value Vth1 (i.e., a threshold value to compare with potential difference Vsfw between both ends of the first resistor 31) to determine that a current flows through the diode element 22a.

The current detection unit 12 outputs an H-level signal if potential difference Vsfw between both ends of the first resistor 31 is larger than or equal to threshold value Vth1, namely, if an absolute value of potential difference Vsfw is smaller than or equal to an absolute value of threshold value Vth1. The current detection unit 12 outputs an L-level signal if potential difference Vsfw is smaller than threshold value Vth1, namely, if an absolute value of potential difference Vsfw exceeds an absolute value of threshold value Vth1. According to the configuration, the sense power supply V2 applies a negative-potential voltage to one end of the first resistor 31. The other end of the first resistor 31 is connected to the switch element 40. A potential difference between both ends of the first resistor 31 is 0 when the switch element 40 is off. A potential at position P1 is negative when a current flows from the ground through the second resistor 32 and the switch element 40 to the second current pathway 52. Diode current detection threshold value Vth1 is preferably set to a negative value slightly smaller than 0. According to the configuration, the current detection unit 12 outputs an L-level signal when a current flows through the first resistor 31. The current detection unit 12 outputs an H-level signal when no current flows through the first resistor 31.

The overcurrent detection unit 14 detects an electric current state of a current flowing through the second resistor 32. According to the configuration, the second resistor 32 is provided between the emitter of the IGBT sense element 21b and the ground. The second resistor 32 is connected to the IGBT sense element 21b in series. The second resistor 32 corresponds to an example of a second resistor unit. The overcurrent detection unit 14 is supplied with an input signal, namely, potential difference Vsig (also denoted as Vs_ig) between both ends of the second resistor 32. The overcurrent detection unit 14 compares the input signal (i.e., potential difference Vsig) with a specified threshold value to determine whether or not an overcurrent flows through the second resistor 32.

The overcurrent detection unit 14 includes overcurrent detection threshold value Vth2 (i.e., a threshold value to compare with a potential difference between both ends of the second resistor 32) to determine whether or not an overcurrent flows through the IGBT element 21a. The overcurrent detection unit 14 outputs an L-level signal if potential difference Vsig between both ends of the second resistor 32 is larger than or equal to threshold value Vth2. The overcurrent detection unit 14 outputs an H-level signal if potential difference Vsig between both ends of the second resistor 32 is smaller than threshold value Vth2. The example in FIG. 3 represents a potential at position P2 with reference to the ground as potential difference Vsig. An overcurrent flowing through the IGBT element 21a increases the value of a sense current flowing from the IGBT sense element 21b to the second resistor 32. Overcurrent detection threshold value Vth2 needs to be positive because potential difference Vsig between both ends of the second resistor 32 is an increased positive value.

Operation of the semiconductor device 1 will be described.

First, the following describes a case where a normal current (not an overcurrent) flows through the IGBT element 21a. When the IGBT element 21a is driven normally (i.e., no current flows through the diode element 22a), a current proportional to a current flowing through the IGBT element 21a flows through the IGBT sense element 21b into the second resistor 32. At this time, the diode element 22a turns off. No current flows through the diode sense element 22b. The switch element 40 turns off to zero potential difference Vsfw in the first resistor 31. The current detection unit 12 outputs an H-level signal because potential difference Vsfw is larger than diode current detection threshold value Vth1 as a negative value.

If a current other than an overcurrent flows through the IGBT element 21a, potential difference Vsig between both ends of the second resistor 32 is smaller than threshold value Vth2. The overcurrent detection unit 14 outputs an H-level signal. In this case, the gate driving unit 10 permits flow of PWM gate signal Sa. When an H-level PWM gate signal is input to the gate driving unit 10, the gate driving unit 10 outputs an H-level signal to turn on the IGBT element 21a. This drives the IGBT element 21a and allows a current to flow through a load (not shown) connected to the collector or the emitter of the IGBT element 21a. When an L-level PWM gate signal is inputted to the gate driving unit 10, the gate driving unit 10 outputs an L-level signal to turn off the IGBT element 21a.

When a current flows through the diode element 22a, a current also flows through the diode sense element 22b to turn on the switch element 40. When the switch element 40 turns on, a part of a current from the ground connected to the second resistor 32 flows into the switch element 40 and the second current pathway 52. Potential difference Vsfw between both ends of the first resistor 31 greatly changes to a negative value from the value (zero level) before the switch element 40 turns on. The potential difference Vsfw is smaller than threshold value Vth1. Therefore, the current detection unit 12 outputs an L-level signal.

When a current flows into the diode element 22a, the current detection unit 12 continues to output an L-level signal. The gate driving unit 10 continues to output an L-level signal to inhibit (stop) the flow of PWM gate signal Sa. The gate driving unit 10 stops outputting an on-signal to the gate of the IGBT element 21a while the current detection unit 12 detects a current flowing through the second current pathway 52. During this period, there is no on-signal inputted to the gate of the IGBT element 21a to stop driving the IGBT element 21a. Namely, the IGBT element 21a does not operate when the diode element 22a operates in a forward direction.

According to the configuration, the IGBT element 21a and the diode element 22a are formed over the same semiconductor substrate. The channel for the IGBT element 21a may turn on when the diode element 22a operates in a forward direction. In such a case, the anode and the cathode of the diode element 22a attempt to maintain the same potential. If such a phenomenon occurs, the gate potential for the IGBT element 21a may hinder the diode element 22a from operating forward. However, the configuration can reliably solve this difficulty. The configuration can avoid interference between operation of the diode element 22a and operation of the IGBT element 21a, more specifically, interference between the diode element 22a and the gate signal of the IGBT element 21a. This can prevent a forward voltage for the diode element 22a from increasing and protect the diode element 22a against a loss in the forward voltage.

When an overcurrent flows into the IGBT element 21a, a current (i.e., sense current) flowing from the IGBT sense element 21b into the second resistor 32 increases in proportion to the overcurrent. Potential difference Vsig between both ends of the second resistor 32 also increases. The overcurrent detection unit 14 outputs an L-level signal when potential difference Vsig exceeds overcurrent detection threshold value Vth2.

The overcurrent detection unit 14 continues to output an L-level signal when an overcurrent flows through the IGBT element 21a (when a current flowing through the second resistor 32 exceeds a specified threshold value). The gate driving unit 10 continues to output an L-level signal to inhibit (or stop) the flow of PWM gate signal Sa. The gate driving unit 10 stops outputting an on-signal to the gate of the IGBT element 21a while the overcurrent detection unit 14 detects an overcurrent. During this period, there is no on-signal inputted to the gate of the IGBT element 21a to stop driving the IGBT element 21a. The gate driving unit 10 performs a specified overcurrent protecting operation (to inhibit an on-signal) when a current flowing through the second resistor 32 exceeds a specified threshold value. The gate driving unit 10 can protect the IGBT element 21a against breakdown due to an overcurrent.

According to the configuration, the second current pathway 52 is provided in addition to the first current pathway 51 passing through the diode sense element 22b. The switch element 40 is provided to activate continuity or discontinuity between the first current pathway 51 (i.e., other current pathway) and the second current pathway 52. The switch element 40 turns off when no current flows through the diode sense element 22b. The switch element 40 turns on when a current flows through the diode sense element 22b. The current state of the second current pathway 52 greatly depends on whether or not a current flows through the diode sense element 22b. As a solution to the issue, the current detection unit 12 detects the current state of the second current pathway. This enables to easily and highly accurately detect whether or not a current flows through the diode sense element 22b.

According to the configuration, the sense power supply V2 is provided at a specified position of the second current pathway 52. The first resistor 31 (i.e., resistor unit) is provided between the switch element 40 and the sense power supply V2 along the second current pathway 52. A current flows through the first resistor 31 when the switch element 40 turns on. The current detection unit 12 detects a current flowing through the first resistor 31. The configuration can more greatly vary potential difference Vsfw for the first resistor 31 when a current flows through the diode element 22a (when a current flows through the diode sense element 22b to turn on the switch element 40). This enables to more reliably detect the flow of a current through the diode element 22a.

According to the configuration, the sense power supply V2 applies a negative voltage to one end of the first resistor 31. The other end of the first resistor 31 is connected to the anode side of the diode sense element 22b via the switch element 40. Turning on the switch element 40 supplies the first resistor 31 with a current corresponding to a potential difference between the anode side of the diode sense element 22b and one end of the first resistor 31. This configuration can reliably detect even a small current flowing through the diode element 22a.

The switch element 40 uses a bipolar transistor that is configured in the semiconductor substrate 2 and turns on when a current flows through the diode sense element 22b. This configuration can favorably form a switch element capable of turning on in response to the flow of current through a diode element without increasing the number of processes.

The following describes effects of the configuration in more detail.

Figure 4:
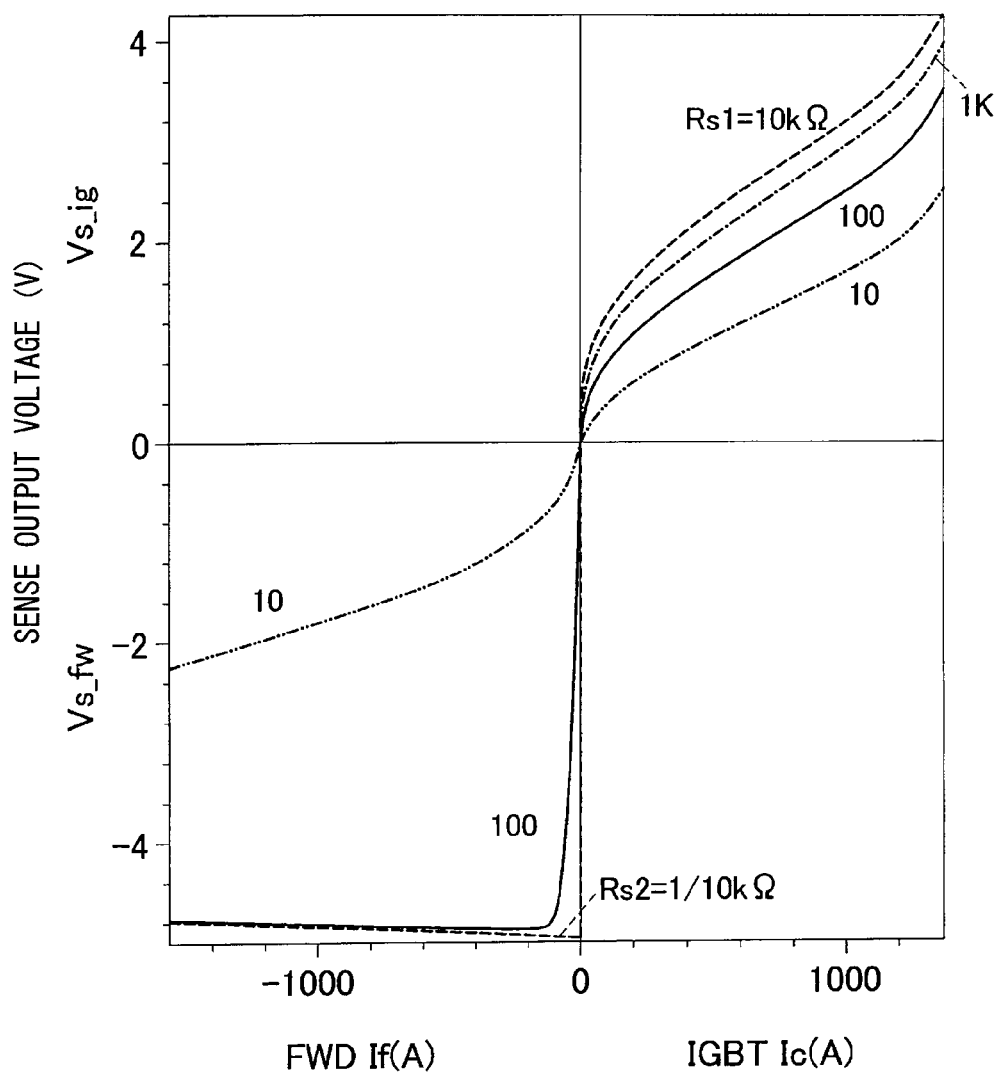
FIG. 4 is a graph illustrating relationship among current Ic (IGBT current) flowing through the IGBT element, current If (i.e., FWD current) flowing through the diode element, and output voltages from sense resistors (i.e., first and second resistors) in the semiconductor device illustrated in FIG. 3 while values of the first and second resistors are varied.
Figure 5:
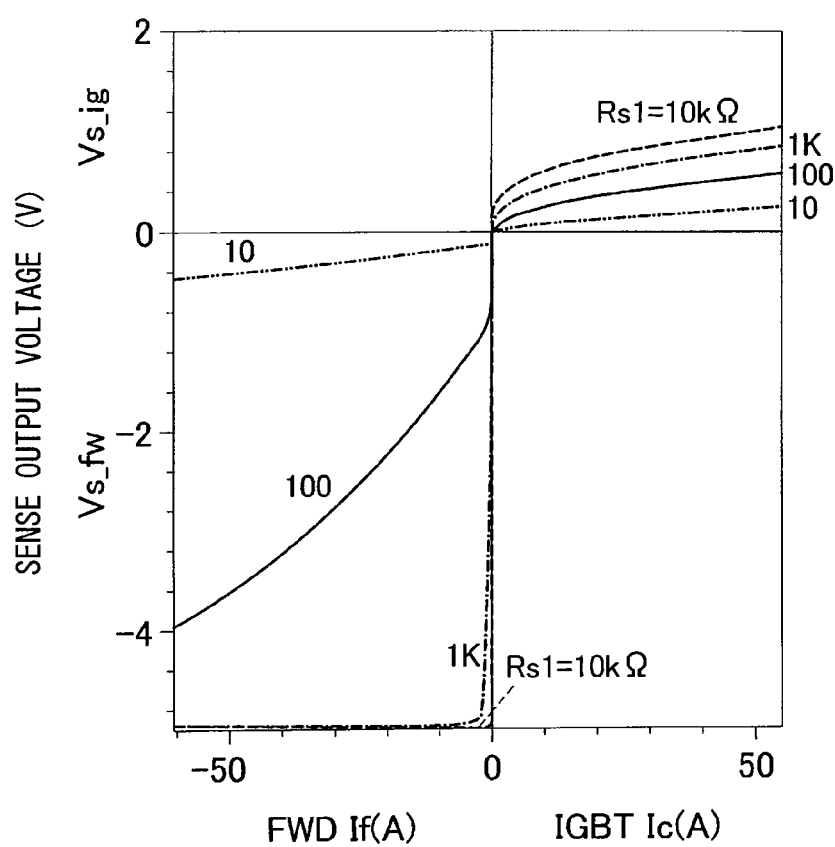
FIG. 5 is a graph partially enlarging the graph in FIG. 4.

An example in FIG. 4 illustrates a simulation result using the configurations in FIGS. 1 through 3. According to the examples in FIGS. 4 and 5, the horizontal axis represents a current value and the vertical axis represents an output voltage. In more detail, the positive region for the horizontal axis represents a current value for the IGBT element 21a. The negative region for the horizontal axis represents a current value for the diode element 22a. The positive region for the vertical axis represents potential difference Vsig (Vs_ig) for the second resistor 32. The negative region for the vertical axis represents potential difference Vsfw (Vs_fw) for the first resistor 31. The positive region for the horizontal and vertical axes illustrates a change in setting the value of the second resistor 32 (Rs1) to 10 kΩ, 1 kΩ, 100Ω, and 10Ω. A broken line represents 10 kΩ. A chain line represents 1 kΩ. A solid line represents 100Ω. A two-dot chain line represents 10Ω. The negative region for the horizontal and vertical axes illustrates a change in setting the value of the first resistor 31 (Rs2) to 10 kΩ, 1 kΩ, 100Ω, and 10Ω. A broken line represents 10 kΩ. A chain line represents 1 kΩ. A solid line represents 100Ω. A two-dot chain line represents 10Ω. FIG. 5 enlarges part of FIG. 4 and illustrates the same simulation result as FIG. 4. This example uses −5 V as a voltage for the sense power supply V2 (a voltage applied to one end of the first resistor 31).

In the configuration according to the embodiment, as illustrated in FIGS. 4 and 5, potential difference Vsfw for the first resistor 31 indicates a very large absolute value even if a small current flows through the diode element 22a. When a resistance value of the first resistor 31 is set to 1 kΩ or 10 kΩ as illustrated in FIG. 5, a current of several amperes flowing through the diode element 22a can change potential difference Vsfw to approximately −5 V. A remarkable effect also results when the resistance value of the first resistor 31 is set to 10Ω or 100 Q as illustrated in FIG. 5. When the resistance value is set to 100Ω, a current of approximately −60 A flowing through the diode element 22a can change potential difference Vsfw to approximately −4 V.

Figure 7:
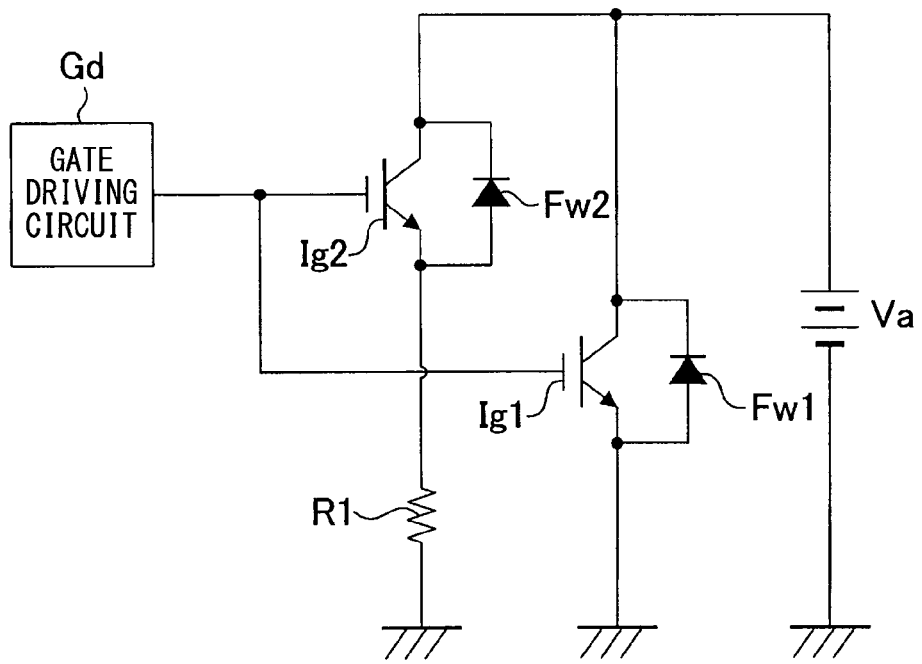
FIG. 7 is a circuit diagram illustrating a circuit configuration of the semiconductor device as a comparative example.
Figure 8:
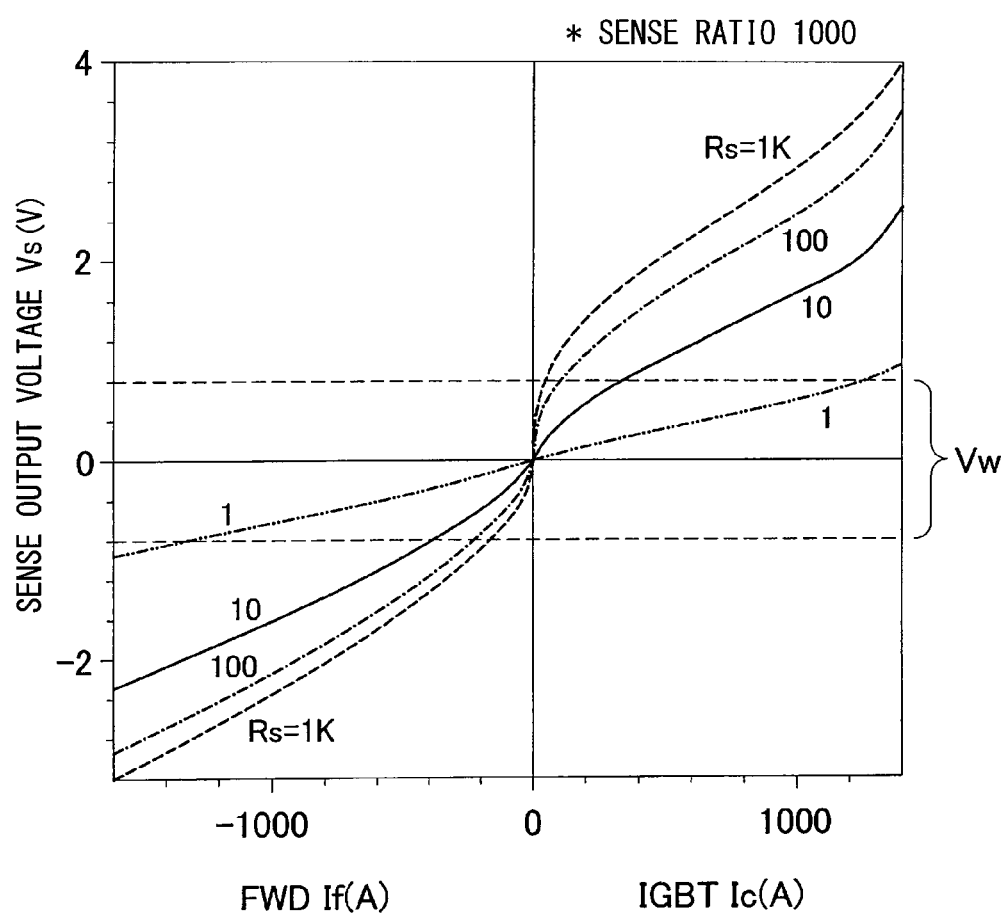
FIG. 8 is a graph illustrating relationship among a current (i.e., IGBT current) flowing through IGBT element Ig1, a current (i.e., FWD current) flowing through diode element Fw1, and an output voltage from sense resistor R1 in the semiconductor device illustrated in FIG. 7 while a value of sense resistor R1 is varied.

FIGS. 7 and 8 provide comparative examples. A graph in FIG. 8 illustrates current detection using a sense resistor R1 according to a prior art configuration as illustrated in FIG. 7. The example in FIG. 8 also uses the horizontal axis to represent a current value and uses the vertical axis to represent an output voltage. In more detail, the positive region for the horizontal axis represents a current value for an IGBT element Ig1 illustrated in FIG. 7. The negative region for the horizontal axis represents a current value for a diode element Fw1 illustrated in FIG. 7. The positive region for the vertical axis represents a potential difference (when an IGBT current is detected) for the sense resistor R1 with reference to the ground. The negative region for the vertical axis represents a potential difference (when a diode current is detected) for the sense resistor R1 with reference to the ground. The positive region for the horizontal and vertical axes illustrates a change in setting the value of the second resistor 32 (Rs1) to 1 kΩ, 100 Ω, 10Ω, and 1Ω. A broken line represents 1 kΩ. A chain line represents 100Ω. A solid line represents 10Ω. A two-dot chain line represents 1 Ω.

The negative region for the horizontal and vertical axes illustrates a change in setting the value of the sense resistor R1 (Rs) to 1 kΩ, 100 Ω, 10Ω, and 1Ω. A broken line represents 1 kΩ. A chain line represents 100Ω. A solid line represents 10Ω. A two-dot chain line represents 1Ω. The example configures the IGBT element Ig1, the diode element Fw1, the IGBT sense element Ig2, and the diode sense element Fw2 similarly to the IGBT element 21a, the diode element 22a, the IGBT sense element 21b, and the diode sense element 22b according to the first embodiment. The switch element 40, the second current pathway 52, and the sense power supply V2 are omitted from the configuration in FIG. 3. Similarly to the first embodiment, an area ratio between the IGBT element and the IGBT sense element is set to 1000:1. An area ratio between the diode element and the diode sense element is set to 1000:1.

As illustrated in FIG. 8, the comparative example shows that the potential difference (when a diode current is detected) for the sense resistor R1 does not vary so remarkably in comparison with the amount of current flowing through the diode element Fw1. The potential difference for the sense resistor R1 varies between −1 V and 0 V when the amount of current flowing through the diode element Fw1 is several tens of amperes or less. The absolute value is very small. By contrast, the present invention provides the remarkable effect as illustrated in FIGS. 4 and 5 and can obviously improve the detection accuracy in a range of small current.

Figure 6:
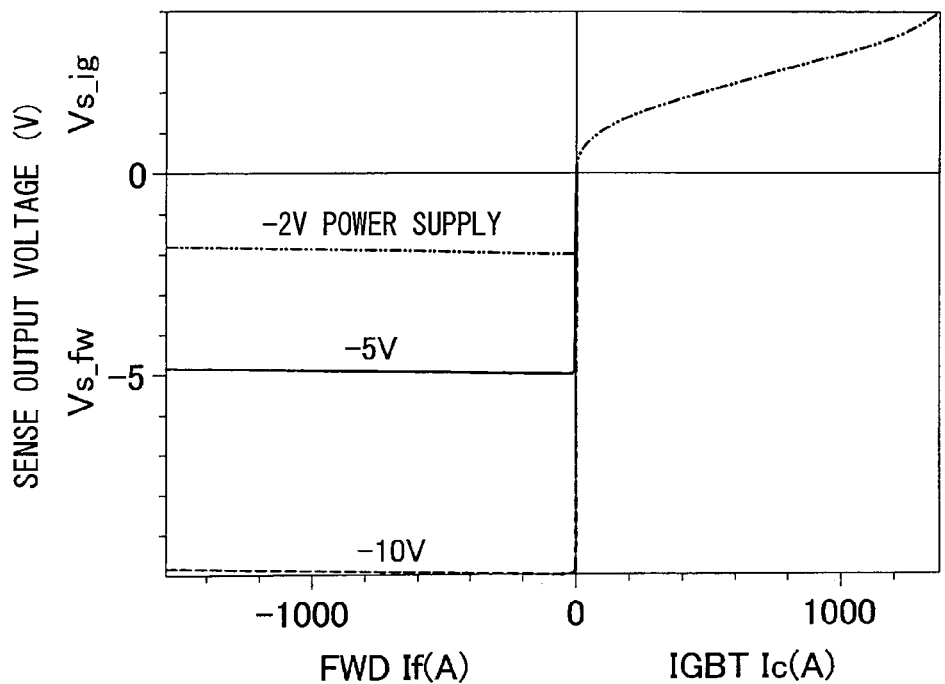
FIG. 6 is a graph illustrating relationship among current Ic (i.e., IGBT current) flowing through the IGBT element, current If (i.e., FWD current) flowing through the diode element, and output voltages from sense resistors (first and second resistors) in the semiconductor device illustrated in FIG. 3 while a voltage of sense power supply V2 is varied.

An example in FIG. 6 also illustrates a simulation result using the configurations in FIGS. 1 through 3. According to the example in FIG. 6, the horizontal axis represents a current value and the vertical axis represents an output voltage. In more detail, the positive region for the horizontal axis represents a current value for the IGBT element 21a. The negative region for the horizontal axis represents a current value for the diode element 22a. The positive region for the vertical axis represents potential difference Vsig for the second resistor 32. The negative region for the vertical axis represents potential difference Vsfw for the first resistor 31. The positive region for the horizontal and vertical axes illustrates a change in setting the sense power supply V2 to −2 V (−5 V or −10 V likewise).

The negative region for the horizontal and vertical axes illustrates a change in setting the sense power supply V2 to −2 V, −5 V, and −10 V. A two-dot chain line represents −2 V. A solid line represents −5 V. A broken line represents −10 V. In this example, the first resistor 31 and the second resistor 32 are each set to 1 kΩ. As clearly understood from the example in FIG. 6, the first resistor 31 having its resistance value set to approximately 1 kΩ can approximate potential difference Vsfw for the first resistor 31 to the voltage of the sense power supply V2 even if the current value for the diode element 22a is very small.

(Second Embodiment)

Figure 9:
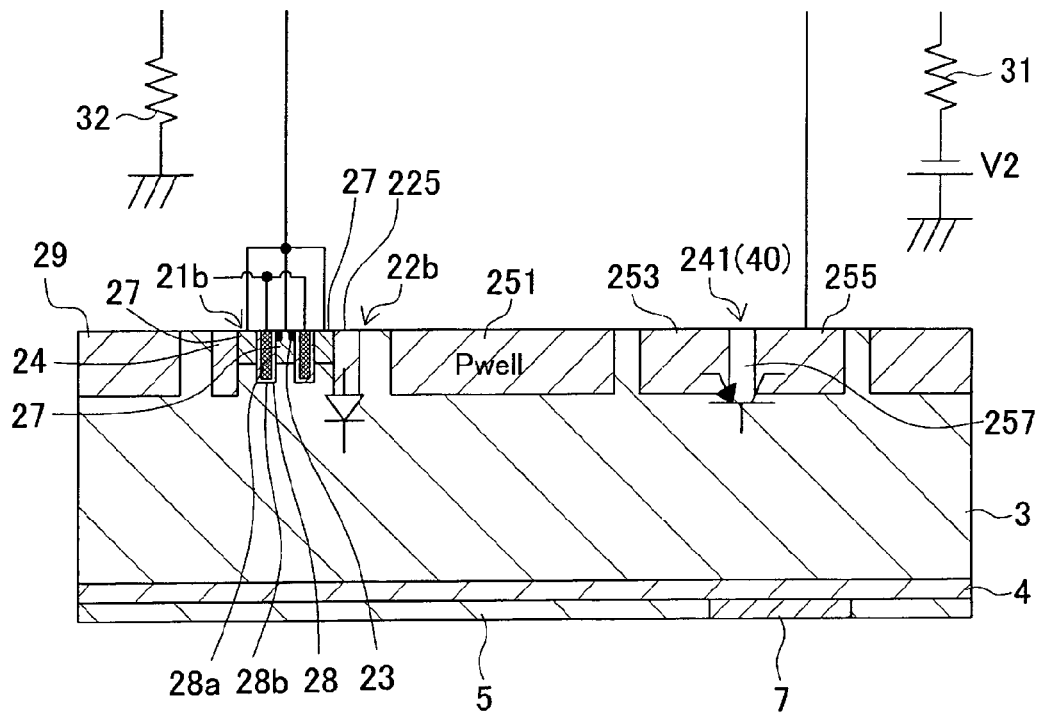
FIG. 9 is a schematic diagram illustrating a sectional configuration of the semiconductor device according to a second embodiment.
Figure 10:
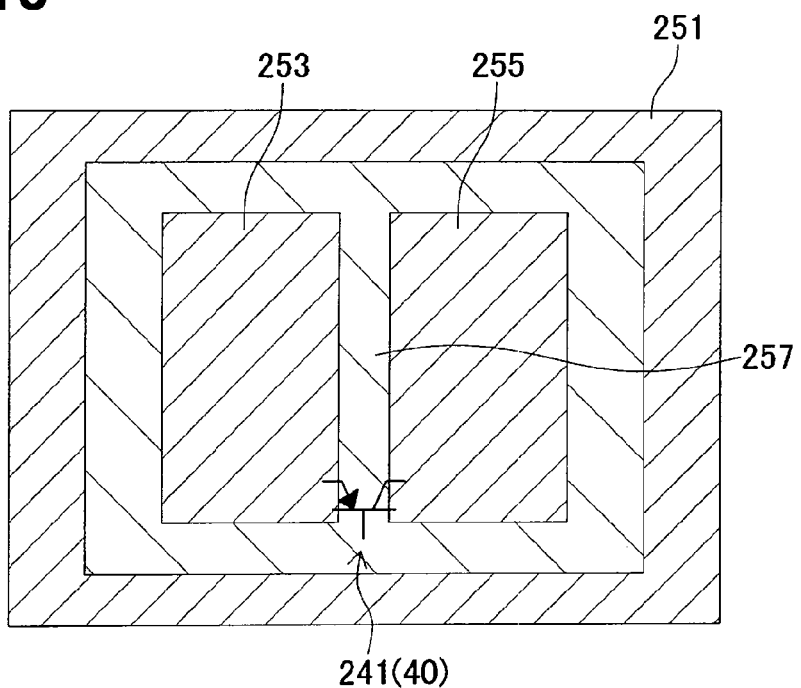
FIG. 10 is a schematic diagram illustrating a planar configuration of the semiconductor device illustrated in FIG. 9 near a switch element.

The second embodiment will be described with reference to FIGS. 9 and 10. FIG. 9 provides a modification example that changes a positional configuration in FIG. 2. FIG. 10 shows the vicinity of the switch element in the surface layer portion toward the first principal surface. The second embodiment differs from the first embodiment only in the configuration near the switch element 40. The other parts of the second embodiment are similar to the first embodiment. The mutually corresponding parts in the second embodiment and the first embodiment are designated by the same reference numerals and a detailed description is omitted for simplicity. In particular, the semiconductor device 1 according to the second embodiment includes the IGBT sense element 21b and the diode sense element 22b that are configured similarly to the first embodiment. The basic circuit configuration is similar to that illustrated in FIG. 3. The gate driving unit 10, the current detection unit 12, and the overcurrent detection unit 14 operate similarly to the first embodiment. The first embodiment provides the P-type emitter region 25. The second embodiment configures an anode region 225, namely, a P-type region similar to the emitter region 25. This region also functions as an anode of the diode sense element 22b.

The switch element 40 is arranged at a position distant from the sense region AR2 where the IGBT sense element 21b and the diode sense element 22b are provided. Specifically, a P-type P-well region 251 intervenes between the sense region AR2 and the switch element 40 in the surface layer toward the first principal surface while the sense region AR2 is provided with the IGBT sense element 21b and the diode sense element 22b. As illustrated in FIGS. 9 and 10, a P-type emitter region 253 is provided at a position distant from the P-well region 251. The emitter region 253 functions as an emitter of a PNP transistor 241. The emitter region 253 may be connected to an electrode shared by the anode region 225. The emitter region 253 may be connected to an electrode shared by the P-well region 251 and may be grounded. A P-type (P) collector region 255 is selectively formed distantly from the emitter region 253. The collector region 255 functions as a collector of the PNP transistor 241. An N-type region intervenes between the emitter region 253 and the collector region 255. This part is configured as the PNP transistor 241 and functions as the switch element 40. The N-type intervenes between the anode region 225 and the P-well region 251. The N-type also intervenes between the P-well region 251 and the emitter region 253. According to this configuration, the basic operation is similar to the first embodiment. The PNP transistor 241 turns on when a current flows through the diode element 22a (namely through the diode sense element 22b). Turning on the PNP transistor 241 allows a current to flow through the second current pathway 52.

According to the configuration, the intervening P-well region 251 separates the region provided with the IGBT sense element 21b from the region provided with the PNP transistor 241. The PNP transistor 241 is not easily subject to an effect of turning on the IGBT sense element 21b. An injected hole hardly reaches the PNP transistor 241 when an IGBT sense current flows between the collector and the emitter of the IGBT sense element 21b. The PNP transistor 241 hardly malfunctions due to an IGBT sense current. The N-type region intervenes between the P-well region 251 and the emitter region 253. A hole may be injected and absorbed into the P-well region 251 when the IGBT sense element 21b operates. In such a case, the hole hardly affects the emitter region 253. An effect of the hole can be avoided more effectively.

(Third Embodiment)

Figure 11:
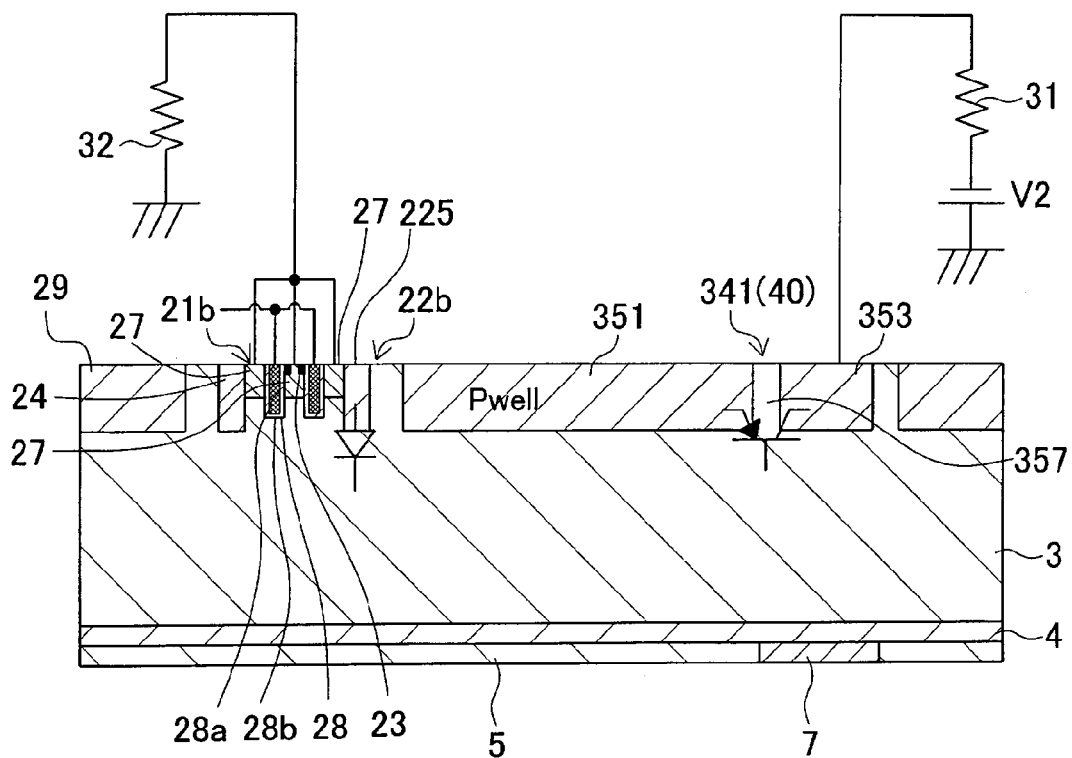
FIG. 11 is a schematic diagram illustrating a sectional configuration of the semiconductor device according to a third embodiment.
Figure 12:
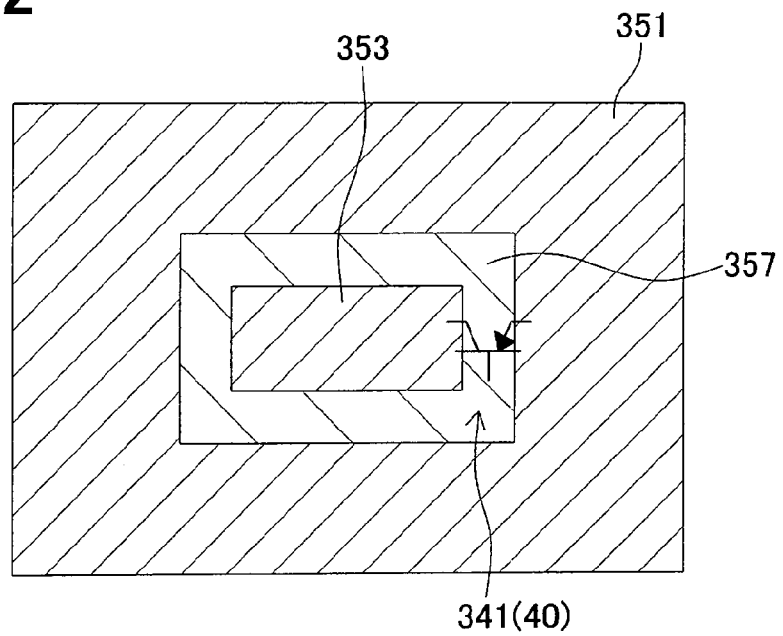
FIG. 12 is a schematic diagram illustrating a planar configuration of the semiconductor device illustrated in FIG. 11 near a switch element.

The third embodiment will be described with reference to FIGS. 11 and 12. FIG. 11 provides a modification example that changes a positional configuration in FIG. 2. FIG. 12 shows the vicinity of the switch element in the surface layer portion toward the first principal surface. The third embodiment differs from the first embodiment only in the configuration near the switch element 40. The other parts of the third embodiment are similar to the first embodiment. The mutually corresponding parts in the third and the first embodiments are designated by the same reference numerals and a detailed description is omitted for simplicity. In particular, the semiconductor device 1 according to the third embodiment includes the IGBT sense element 21b and the diode sense element 22b that are configured similarly to the first embodiment. The basic circuit configuration is similar to that illustrated in FIG. 3. The gate driving unit 10, the current detection unit 12, and the overcurrent detection unit 14 operate similarly to the first embodiment. The first embodiment provides the P-type emitter region 25. The third embodiment configures an anode region 325, namely, a P-type region similar to the emitter region 25. This region also functions as an anode of the diode sense element 22b.

The switch element 40 is arranged at a position distant from the sense region AR2 provided with the IGBT sense element 21b and the diode sense element 22b. Specifically, a P-type P-well region 351 is provided at a position distant from the sense region AR2 provided with the IGBT sense element 21b and the diode sense element 22b. The P-well region 351 is provided as a P-type emitter region. The P-well region 351 functions as an emitter of the PNP transistor 341. The P-well region 351 is grounded. This example connects the emitter of the circuit in FIG. 3 to the ground, not to the anode of the diode sense element.

A collector region 353 of P-type (P) is selectively formed at a position distant from the P-well region 351. The collector region 353 functions as a collector of the PNP transistor 341. An N-type region intervenes between the emitter region (i.e., P-well region 351) and the collector region 353. This part is configured as the PNP transistor 341 and functions as the switch element 40. The N-type region also intervenes between the P-well region 351 and the anode region 225. According to this configuration, the basic operation is similar to the first embodiment. The PNP transistor 341 also turns on when a current flows through the diode element 22a (namely through the diode sense element 22b). Turning on the PNP transistor 341 allows a current to flow through the second current pathway 52.

This configuration also enables the PNP transistor 341 to be arranged distantly from the IGBT sense element 21b. The PNP transistor 341 is not easily subject to an effect of turning on the IGBT sense element 21b. The layout efficiency improves because the P-well region 351 can be used as an emitter of the PNP transistor 341.

(Fourth Embodiment)

Figure 13:
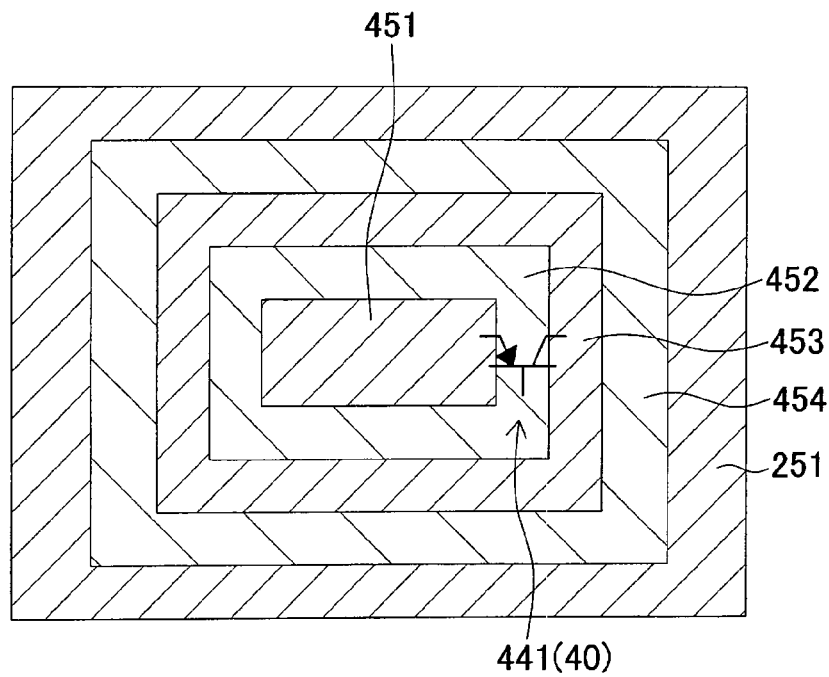
FIG. 13 is a schematic diagram illustrating a planar configuration of the semiconductor device according to a fourth embodiment near a switch element.

The fourth embodiment will be described with reference to FIG. 13. FIG. 13 illustrates a configuration near the switch element 40 toward the surface layer of the first principal surface of the semiconductor device according to the fourth embodiment. The fourth embodiment differs from the first and the second embodiments only in the configuration near the switch element 40. The other parts of the fourth embodiment are similar to the first and the second embodiments. In particular, only an inner region enclosed in the P-well region 251 differs from the second embodiment. The other parts are identical to the second embodiment. The P-well region 251 and its outside region are identical to the second embodiment and a detailed description is omitted for simplicity.

According to the configuration, the switch element 40 is also arranged at a position distant from the sense region AR2 provided with the IGBT sense element 21b and the diode sense element 22b. Specifically, the P-type P-well region 251 intervenes between the switch element 40 and the sense region AR2 provided with the IGBT sense element 21b and the diode sense element 22b. The sense region AR1 is configured similarly to FIGS. 1 and 2. The P-well region 251 is configured similarly to FIG. 9. As illustrated in FIG. 13, a P-type looped collector region 453 is provided distantly from the P-well region 251. The collector region 453 functions as a collector of a PNP transistor 441. The collector region 453 is connected to the second current pathway 52 similarly to the first embodiment. An N-type looped region 454 is provided between the P-well region 251 and the collector region 453.

A P-type (P) emitter region 451 is selectively formed at a position distant from the collector region 453. The emitter region 451 functions as an emitter of the PNP transistor 441. An N-type looped region 452 intervenes between the emitter region 451 and the collector region 453 surrounding the emitter region 451. These parts are configured as the PNP transistor 441 functioning as the switch element 40. The PNP transistor 441 also turns on when a current flows through the diode element 22a (namely through the diode sense element 22b). Turning on the PNP transistor 441 allows a current to flow through the second current pathway 52.

(Fifth Embodiment)

Figure 14:
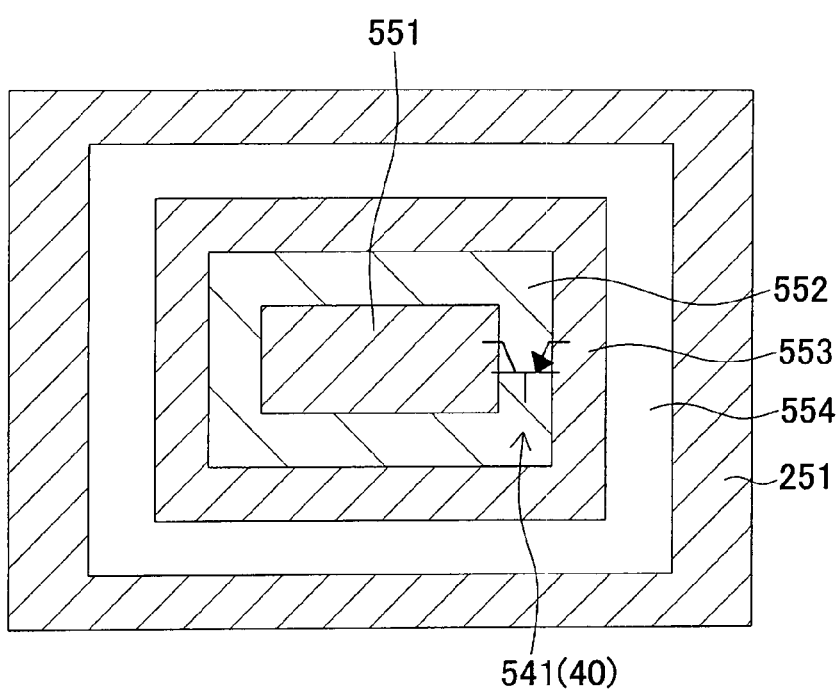
FIG. 14 is a schematic diagram illustrating a planar configuration of the semiconductor device according to a fifth embodiment near a switch element.

The fifth embodiment will be described with reference to FIG. 14. FIG. 14 illustrates a configuration near the switch element 40 toward the surface layer of the first principal surface of the semiconductor device according to the fifth embodiment. The fifth embodiment differs from the first and the second embodiments only in the configuration near the switch element 40. The other parts of the fifth embodiment are similar to the first and the second embodiments. In particular, only an inner region enclosed in the P-well region 251 differs from the second embodiment. The other parts are equal to the second embodiment. The P-well region 251 and its outside region are equal to the second embodiment and a detailed description is omitted for simplicity.

According to the configuration, the switch element 40 is also arranged at a position distant from the sense region AR2 provided with the IGBT sense element 21b and the diode sense element 22b. Specifically, the P-type P-well region 251 intervenes between the switch element 40 and the sense region AR2 provided with the IGBT sense element 21b and the diode sense element 22b. The sense region AR1 is configured similarly to FIGS. 1 and 2. The P-well region 251 is configured similarly to FIG. 9. As illustrated in FIG. 14, a P-type looped emitter region 553 is provided distantly from the P-well region 251. The emitter region 553 functions as an emitter of a PNP transistor 541.

A P-type (P) collector region 551 is selectively formed at a position distant from the emitter region 553. The collector region 551 functions as a collector of the PNP transistor 541. The collector region 551 is connected to the second current pathway 52 similarly to the first embodiment. An N-type looped region 552 intervenes between the collector region 551 and the emitter region 553 surrounding the collector region 551. These parts are configured as the PNP transistor 541 functioning as the switch element 40. The PNP transistor 541 also turns on when a current flows through the diode element 22a (namely through the diode sense element 22b). Turning on the PNP transistor 541 allows a current to flow through the second current pathway 52.

(Sixth Embodiment)

The sixth embodiment will be described with reference to FIGS. 16 and 17.

The sixth embodiment differs from the first embodiment in the configuration near the switch element 40 and the layout of the semiconductor substrate 2. The other parts of the sixth embodiment are similar to the first embodiment. The structure in the semiconductor substrate is similar to the third embodiment. The mutually corresponding parts in the sixth, first, and third embodiments are designated by the same reference numerals and a detailed description is omitted for simplicity. In particular, the semiconductor device 1 according to the sixth embodiment includes the IGBT sense element 21b and the diode sense element 22b that are configured similarly to the first embodiment. The basic circuit configuration is similar to the one illustrated in FIG. 3. The gate driving unit 10, the current detection unit 12, and the overcurrent detection unit 14 operate similarly to the first embodiment. The first embodiment provides the P-type emitter region 25. The sixth embodiment configures an anode region 625, namely, a P-type region similar to the emitter region 25. This region also functions as an anode of the diode sense element 22b.

The switch element 40 is arranged at a position distant from the sense region AR2 provided with the IGBT sense element 21b and the diode sense element 22b. Specifically, A P-type P-well region 651 is provided at a position distant from the sense region AR2 provided with the IGBT sense element 21b and the diode sense element 22b. The P-well region 651 is provided as a P-type emitter region. The P-well region 651 functions as an emitter of the PNP transistor 641. The P-well region 351 is grounded. This example connects the emitter of the circuit in FIG. 3 to the ground, not to the anode of the diode sense element.

A P-type (P) collector region 653 is selectively formed at a position distant from the P-well region 651. The collector region 653 functions as a collector of the PNP transistor 641. An N-type region 657 intervenes between the emitter region (i.e., P-well region 651) and the collector region 653. This part is configured as the PNP transistor 641 functioning as the switch element 40. The PNP transistor 641 also turns on when a current flows through the diode element 22a (namely through the diode sense element 22b). Turning on the PNP transistor 641 allows a current to flow through the second current pathway 52.

Figure 15:
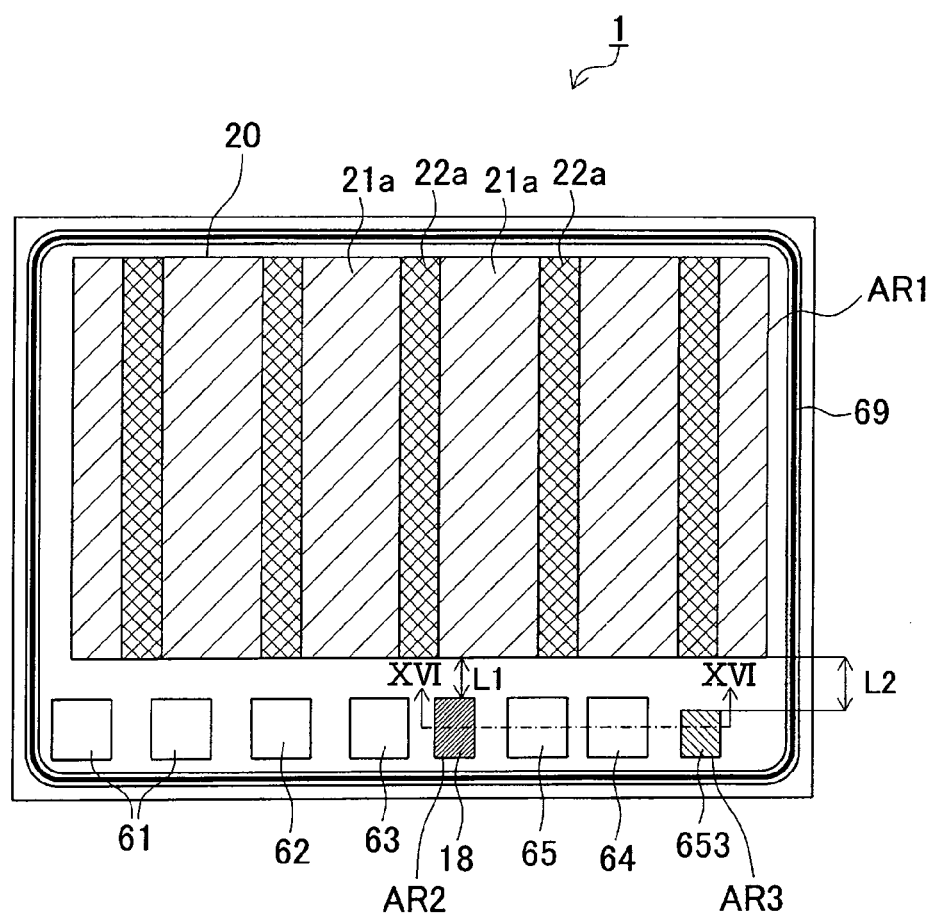
FIG. 15 is a pattern diagram illustrating a planar configuration of a semiconductor substrate in the semiconductor device according to a sixth embodiment.

This example provides an insulation layer such as SiO2 so as to cover the top of the P-well region 651 arranged between the sense region AR2 and the collector region 653. As illustrated in FIG. 15, a diode sense pad 64 and an emitter pad 65 are arranged over the insulation layer. The diode sense pad 64 is connected to the collector region 653. The emitter pad 65 is connected to the emitter of the IGBT element 21a. When viewed in plan as illustrated in FIG. 15, the diode sense pad 64 and the emitter pad 65 are arranged between the sense region AR2 and the collector region 653.

In this example as illustrated in FIG. 15, distance L2 between the main region AR1 and the collector region 653 is longer than distance L1 between the main region AR1 and the sense region AR2. The end of the collector region 653 toward the main region AR1 is positioned farther from the main region AR1 than the end of the sense region AR2 toward the main region AR1. This arrangement can effectively prevent the PNP transistor 641 from malfunctioning due to a Hall current generated during IGBT operation in the main region AR1 and easily prevent incorrect detection of diode operation. Suppose that the semiconductor substrate 2 has the thickness (material thickness) of approximately 130 μm to ensure a withstand voltage of approximately 1200 V. In such a case, distance L2 is favorably set to be double the thickness (i.e., material thickness) of the semiconductor substrate 2 or more.

Figure 16:
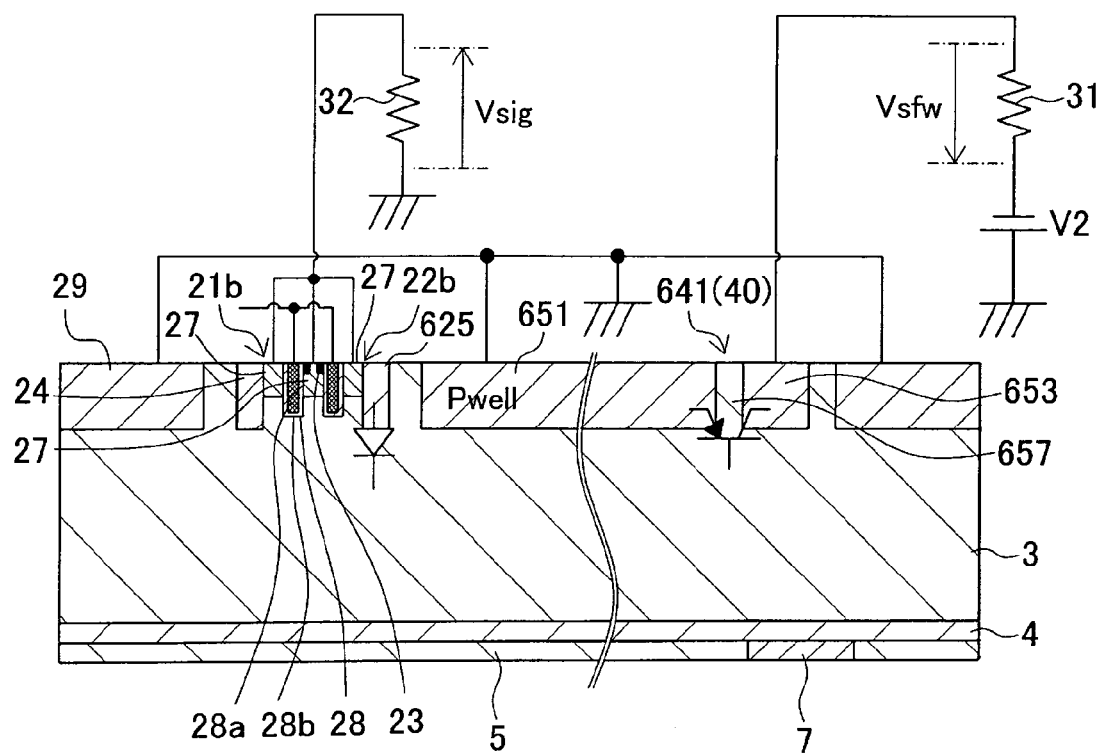
FIG. 16 is a pattern diagram illustrating a cross sectional view and a circuit configuration taken along the line XVI-XVI of the semiconductor device in FIG. 15.

According to the example as illustrated in FIG. 16, a cathode layer 7 functioning as a cathode of the diode sense element 22b is locally arranged near the bottom of the collector region 653. This can hinder injection of an excess hole from a highly concentrated P-well during diode operation and effectively prevent a switch loss.

(Seventh Embodiment)

The seventh embodiment will be described with reference to FIG. 17.

The seventh embodiment differs from the first embodiment in the configuration of the switch element 40. The other parts of the seventh embodiment are similar to the first embodiment. The mutually corresponding parts in the seventh and the first embodiments are designated by the same reference numerals and a detailed description is omitted for simplicity. In particular, the semiconductor device 1 according to the seventh embodiment includes the IGBT sense element 21b and the diode sense element 22b that are configured similarly to the first embodiment. The basic circuit configuration (except the switch element 40 and the second current pathway) is similar to that illustrated in FIG. 3. The gate driving unit 10, the current detection unit 12, and the overcurrent detection unit 14 operate similarly to the first embodiment. The first embodiment provides the P-type emitter region 25. The seventh embodiment configures the anode region 225, namely, a P-type region similar to the emitter region 25. This region also functions as an anode of the diode sense element 22b.

The semiconductor device 1 according to the seventh embodiment includes the main region AR1 and the sense region AR2 that are configured similarly to the first embodiment. The diode-integrated IGBT element 20 includes the diode element 22a and the IGBT element 21a provided for the same semiconductor substrate 2. A drive signal inputted to the gate drives the IGBT element 21a. According to this example also, the collector of the IGBT element 21a and the collector of the IGBT sense element 21b are connected in common. The main power supply V1 is connected to the collectors. The emitter of the IGBT element 21a is connected to the ground. The gate for the IGBT element 21a and the gate for the IGBT sense element 21b are connected in common. The gates are supplied with a drive signal from the gate driving unit 10 similarly to the first embodiment. The anode side of the diode element 22a is connected to the emitter of the IGBT element 21a. The cathode side of the diode element 22a is connected to the collector of the IGBT element 21a. The diode element 22a is connected to the IGBT element 21a in parallel and functions as a free wheeling diode.

The sense element 18 includes the diode sense element 22b and the IGBT sense element 21b. The diode sense element 22b allows flow of a current proportional to a current flowing through the diode element 22a. The IGBT sense element 21b allows flow of a current proportional to a current flowing through the IGBT element 21a. The gate of the IGBT sense element 21b is connected to the gate of the IGBT sense element 21b in common and is supplied with a drive signal from the gate driving unit 10 to be described later. The collector of the IGBT sense element 21b and the collector of the IGBT element 21a are connected in common. The emitter of the IGBT sense element 21b connects with the second resistor 32 similar to the first embodiment. The anode side of the diode sense element 22b is connected to the emitter of the IGBT sense element 21b. The cathode side of the diode sense element 22b is connected to the collector of the IGBT sense element 21b. The diode sense element 22b is connected to the IGBT sense element 21b in parallel. The diode sense element 22b functions as a free wheeling diode.

According to this configuration also, the first current pathway 51 passes through the diode sense element 22b to apply a current to the diode sense element 22b. Suppose that P4 denotes a connection position (i.e., branch position) between the anode of the diode sense element 22b and the source of the switch element 40. The first current pathway 51 leads to the diode sense element 22b from P4. When the switch element 40 turns on, the second current pathway 52 passes through the switch element 40 from position P4.

The switch element 40 includes a P-channel MOS transistor 741 formed in the semiconductor substrate. According to the example in FIG. 17, the gate of the switch element 40 is connected to the sense power supply V2 to be supplied with a fixed voltage. This turns on the switch element 40. The source of the switch element 40 is connected to the anode of the diode sense element 22b and the emitter of the IGBT sense element 21b. The drain of the switch element 40 is connected to the second current pathway 52. The second current pathway 52 is provided with the first resistor 31 and the sense power supply V2. One end of the first resistor 31 connects with a lower voltage side of the sense power supply V2 so that the sense power supply V2 supplies a negative voltage. The other end of the first resistor 31 is continuous with the drain of the switch element 40 and is connected to the anode side of the diode sense element 22b via the switch element 40.

According to this configuration, the sense power supply V2 applies a negative voltage to the gate of the switch element 40 so that the switch element 40 continues to turn on. A current may flow through the diode sense element 22b due to an inverse electromotive force. In such a case, a branch current flows through the switch element 40. The branch current flows between the source and the drain of the switch element 40. Suppose that a current flows through the diode sense element 22b and a branch current flows between the source and the drain of the switch element 40. In this case, a current flowing through the first resistor 31 corresponds to the potential at the anode side of the diode sense element 22b and the potential at one end of the first resistor 31 (namely, the potential difference between the potential at the anode side of the diode sense element 22b and the negative potential of the sense power supply V2). This increases an absolute value of the potential difference for the first resistor 31. Similarly to the first embodiment, the current detection unit 12 outputs an L-level signal when an absolute value of potential difference Vsfw exceeds an absolute value of threshold value Vth1 (namely, when potential difference Vsfw is smaller than threshold value Vth1). Similarly to the first embodiment, the current detection unit 12 outputs an H-level signal when an absolute value of potential difference Vsfw does not exceed an absolute value of threshold value Vth1.

Figure 17:
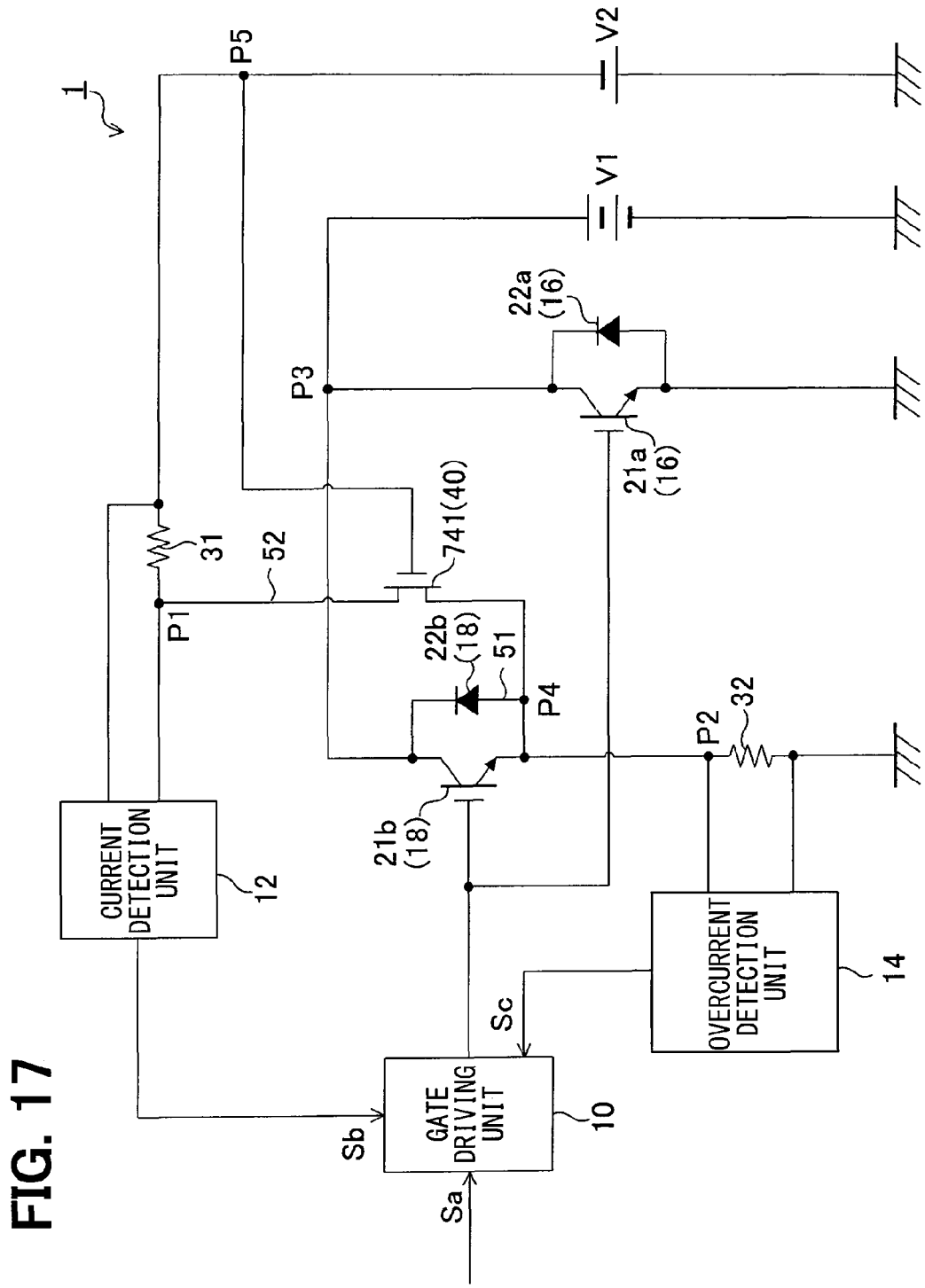
FIG. 17 is a circuit diagram illustrating a circuit configuration of the semiconductor device according to a seventh embodiment.
Figure 18:
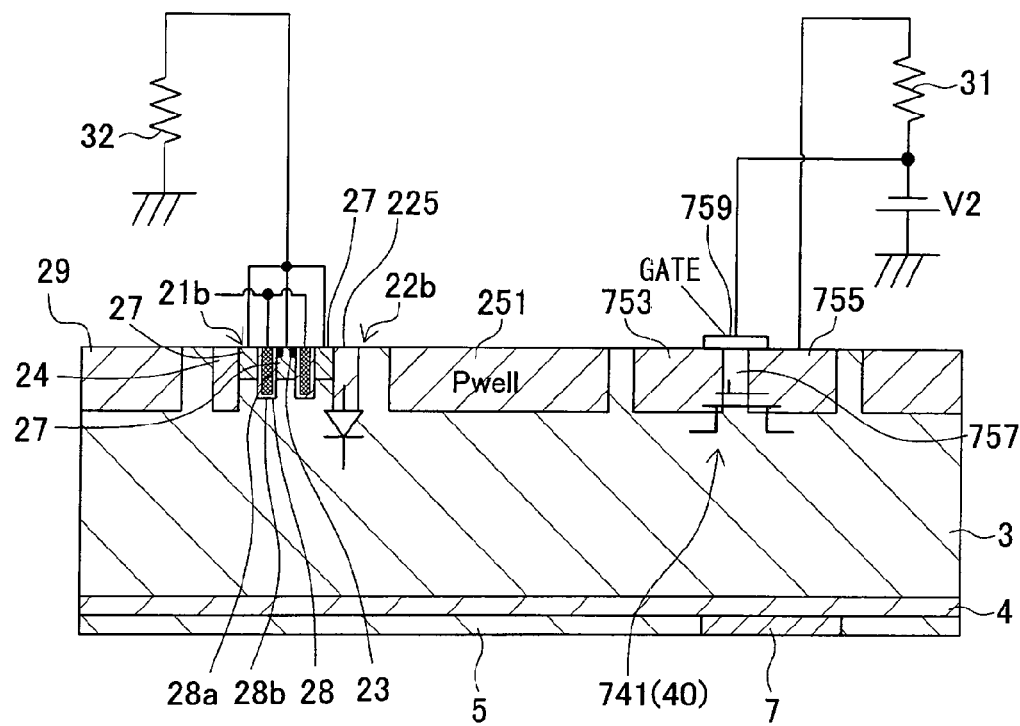
FIG. 18 is a schematic diagram illustrating a sectional configuration of the semiconductor device according to the seventh embodiment.
Figure 19:
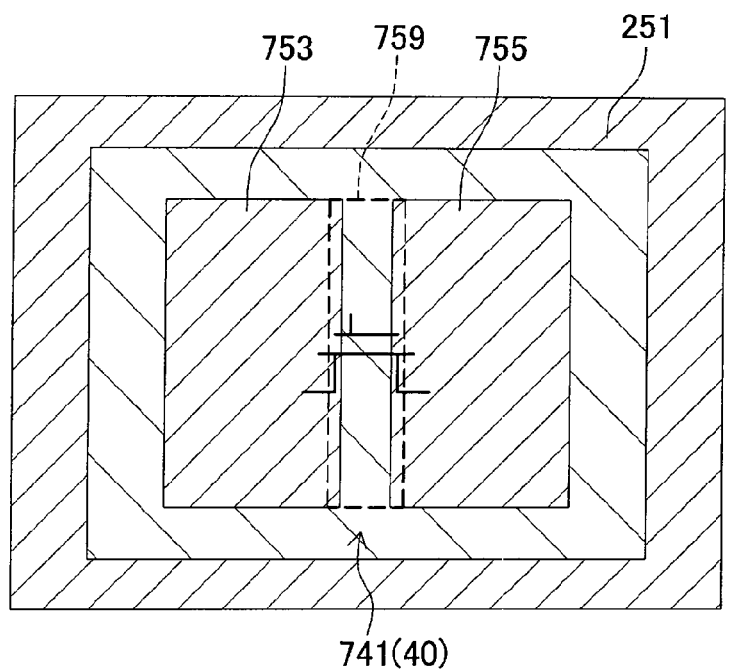
FIG. 19 is a schematic diagram illustrating a planar configuration of the semiconductor device according to the seventh embodiment near a switch element.

The semiconductor device illustrated in FIG. 17 may be configured as illustrated in FIGS. 18 and 19.

According to the example in FIG. 18, the IGBT sense element 21b and the diode sense element 22b are configured similarly to the second embodiment. Similarly to the second embodiment, the P-type anode region 225 and the P-well region 251 are provided.

According to the configuration, the MOS transistor 741 as the switch element 40 is arranged at a position distant from the sense region AR2 provided with the IGBT sense element 21b and the diode sense element 22b. Specifically, the P-type P-well region 251 intervenes between the switch element 40 and the sense region AR2 provided with the IGBT sense element 21b and the diode sense element 22b. As illustrated in FIGS. 18 and 19, a P-type source region 753 is provided distantly from the P-well region 251. The source region 753 functions as a source of the MOS transistor 741. The source region 753 may be connected to an electrode shared by the anode region 225. The source region 753 may be connected to an electrode shared by the P-well region 251 and may be grounded.

A P-type (P) drain region 755 is selectively formed at a position distant from the source region 753. The drain region 755 functions as a drain of the MOS transistor 741. An N-type region (i.e., channel region) 757 intervenes between the drain region 755 and the source region 753. A gate electrode 759 is provided above the drain region 755, the source region 753, and the channel region 757. The MOS transistor 741 according to this configuration functions as the switch element 40. Applying the sense power supply V2 to the gate turns on the MOS transistor 741. When a current flows through the second diode sense element 22b, the MOS transistor 741 functions so that a current corresponding to that current flows through the second current pathway 52. This configuration also provides the effect similar to the second embodiment.

(Eighth Embodiment)

Figure 20:
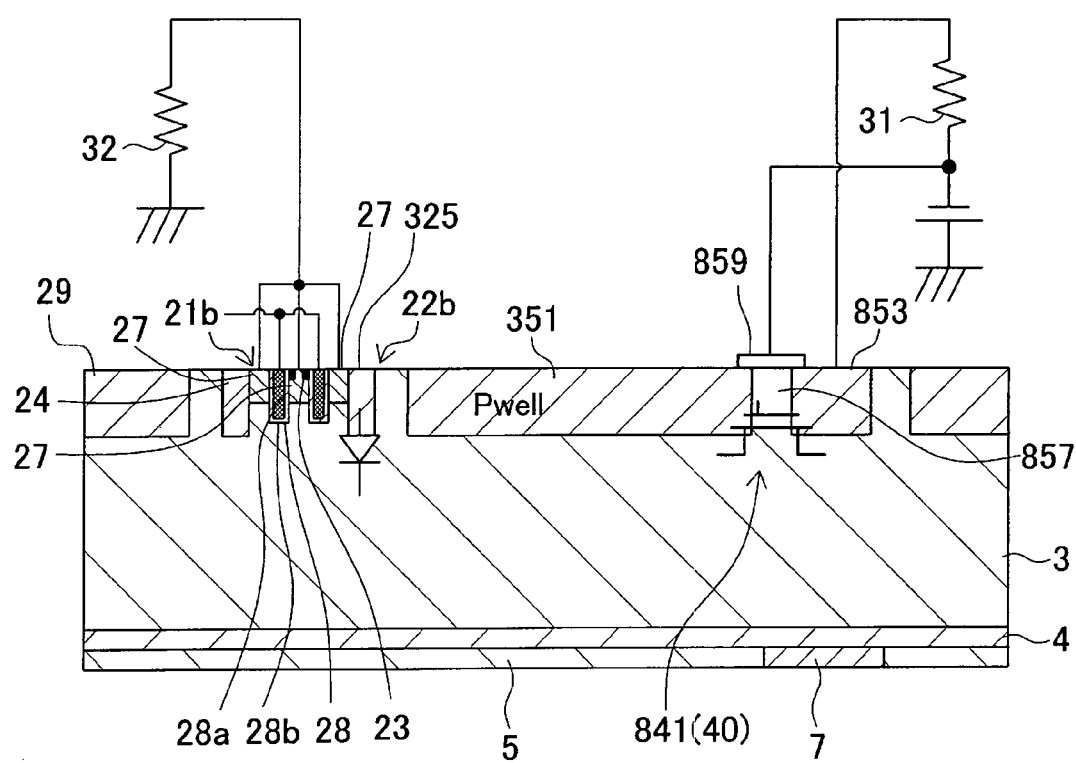
FIG. 20 is a schematic diagram illustrating a sectional configuration of the semiconductor device according to an eighth embodiment.
Figure 21:
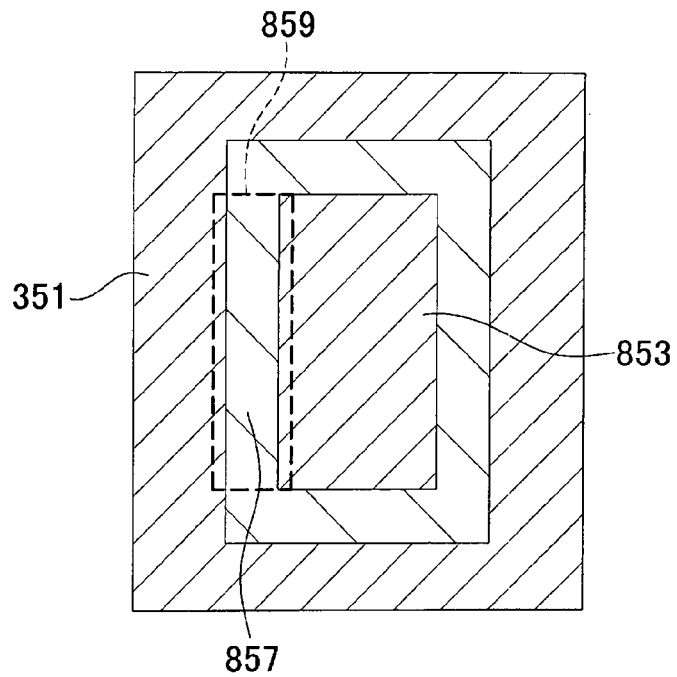
FIG. 21 is a schematic diagram illustrating a planar configuration of the semiconductor device according to the eighth embodiment near a switch element.

The eighth embodiment will be described with reference to FIGS. 20 and 21. FIG. 20 provides a modification example that changes a positional configuration in FIG. 2. FIG. 21 shows the vicinity of the switch element in the surface layer portion toward the first principal surface. The eighth embodiment differs from the seventh embodiment only in the configuration near the switch element 40. The other parts of the eighth embodiment are similar to the seventh embodiment. The mutually corresponding parts in the eighth and the seventh embodiments are designated by the same reference numerals and a detailed description is omitted for simplicity. In particular, the semiconductor device 1 according to the eighth embodiment includes the IGBT sense element 21b and the diode sense element 22b that are configured similarly to the first embodiment. The basic circuit configuration is similar to that illustrated in FIG. 3. The gate driving unit 10, the current detection unit 12, and the overcurrent detection unit 14 operate similarly to the first embodiment. The P-type anode region 325 and the P-well region 351 are provided similarly to the third embodiment.

According to this configuration, a MOS transistor 841 corresponding to the switch element 40 is arranged at a position distant from the sense region AR2 provided with the IGBT sense element 21*b* and the diode sense element 22*b*. Specifically, the P-type P-well region 351 is provided at a position distant from the sense region AR2 provided with the IGBT sense element 21*b* and the diode sense element 22*b*. The P-well region 351 is used as a P-type source region. The well region 351 (i.e., source region) functions as a source of the MOS transistor 841. The P-well region 351 is grounded.

A P-type (P) drain region 853 is selectively formed at a position distant from the P-well region 351 (i.e., source region). The drain region 853 functions as a drain of the MOS transistor 841. An N-type region (i.e., channel region) 857 intervenes between the drain region 853 and the P-well region 351 (i.e., source region). A gate electrode 859 is provided above the drain region 853, the P-well region 351 (i.e., source region), and the channel region 857. The MOS transistor 841 according to this configuration functions as the switch element 40. This configuration also provides the effect similar to the third embodiment.

(Modification)

The present disclosure is not limited to the above-mentioned embodiments but may be otherwise variously embodied within the spirit and scope of the disclosure.

Figure 22:
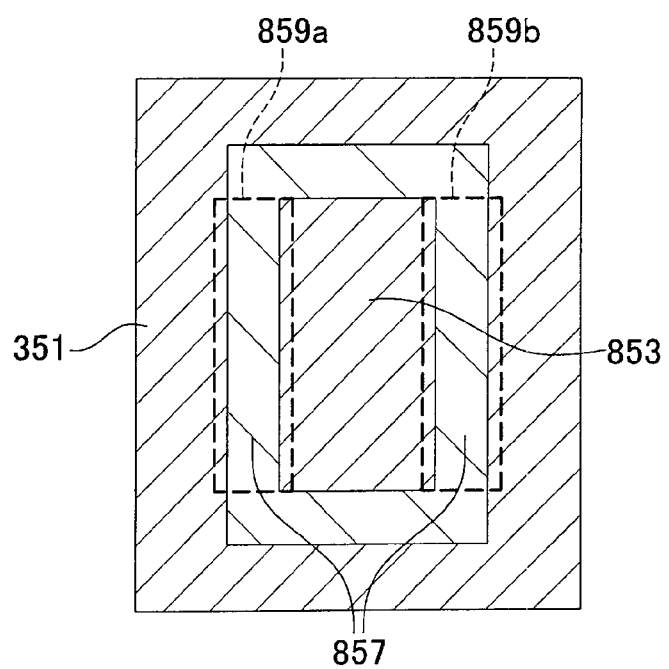
FIG. 22 is a diagram illustrating a modification example of FIG. 21.

According to the example in FIG. 21, the N-type region 857 is provided to surround the drain region 853. The P-well region 351 (i.e., source region) is provided around the region 857. The gate electrode 859 is arranged only at one side of the drain region 853. However, the disclosure is not limited to this configuration. As illustrated in FIG. 22, gate electrodes 859*a* and 859*b* may be arranged at two facing sides (i.e., both ends) of the drain region 853.

The invention claimed is:

1. A semiconductor device, comprising:
    a diode-integrated IGBT element arranged in a same semiconductor substrate including a diode element and an IGBT element driven by a drive signal that is inputted to a gate of the IGBT element;
    a sense element including a diode sense element and an IGBT sense element, the diode sense element being supplied with a current proportional to a current flowing through the diode element, and the IGBT sense element being supplied with a current proportional to a current flowing through the IGBT element;
    a switch element that: is connected to a first current pathway passing through the diode sense element and connected to a second current pathway different from the first current pathway; is turned off to control the second current pathway to be discontinuous with the first current pathway when no current flows through the diode sense element; and is turned on to control the second current pathway to be continuous with the first current pathway and apply a current to the second current pathway when a current flows through the diode sense element; and
    a current detection unit that detects an electric current state of the second current pathway.

2. The semiconductor device according to claim 1, further comprising:
    a sense power supply arranged at a predetermined position of the second current pathway; and
    a resistor unit arranged in the second current pathway between the switch element and the sense power supply,
    wherein the sense power supply applies a voltage to one end of the resistor unit, and another end of the resistor unit is connected to an anode side of the diode sense element or a ground side via the switch element;
    wherein when the switch element is turned off, no current flows through the resistor unit; and when the switch element is turned on, a current flows through the resistor unit, the current corresponding to a potential difference between one of an anode of the diode sense element and a ground and the sense power supply; and
    wherein the current detection unit detects a current flowing through the resistor unit.

3. The semiconductor device according to claim 1, wherein
    the switch element includes a bipolar transistor that is arranged in the semiconductor substrate and is turned on when a current flows through the diode sense element.

4. The semiconductor device according to claim 1, further comprising:
    a gate driving unit that inputs an on-signal and an off-signal to a gate of the IGBT element,
    wherein the gate driving unit stops outputting the on-signal to the gate of the IGBT element when the current detection unit detects a current flowing through the second current pathway.

5. The semiconductor device according to claim 1, further comprising:
    a gate driving unit that inputs an on-signal and an off-signal to a gate of the IGBT element; and
    a second resistor unit connected to the IGBT sense element in series,
    wherein the gate driving unit performs a predetermined overcurrent protecting operation when a current flowing through the second resistor unit is larger than a predetermined threshold value.

6. A semiconductor device, comprising:
    a diode-integrated IGBT element arranged in a same semiconductor substrate including a diode element and an IGBT element driven by a drive signal that is inputted to a gate of the IGBT element;
    a sense element including a diode sense element and an IGBT sense element, the diode sense element being supplied with a current proportional to a current flowing through the diode element, and the IGBT sense element being supplied with a current proportional to a current flowing through the IGBT element;
    a switch element connected to a first current pathway passing through the diode sense element and connected to a second current pathway different from the first current pathway;
    a sense power supply arranged at a predetermined position of the second current pathway;
    a resistor unit arranged in the second current pathway between the switch element and the sense power supply; and
    a current detection unit that is connected to only the second current pathway as one of the first current pathway and the second current pathway of the switch element, and detects a current flowing through the resistor unit when the switch element is turned on.

7. The semiconductor device according to claim 6,
wherein the switch element includes a MOS transistor that is arranged in the semiconductor substrate and is turned on when a current flows through the diode sense element.

8. The semiconductor device according to claim 6, wherein
the switch element is turned on in response to a current flowing through the diode sense element.

* * * * *